United States Patent
Hou et al.

(10) Patent No.: US 10,998,912 B2
(45) Date of Patent: May 4, 2021

(54) DIGITAL-TO-ANALOG CONVERTER TO REDUCE NOISE GENERATED BY A QUIESCENT CURRENT

(71) Applicant: Huawei Technologies Co., Ltd., Shenzhen (CN)

(72) Inventors: Chenlong Hou, Shanghai (CN); Yuemiao Di, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/580,182

(22) Filed: Sep. 24, 2019

(65) Prior Publication Data

US 2020/0021302 A1    Jan. 16, 2020

Related U.S. Application Data

(63) Continuation of application No. PCT/CN2018/081772, filed on Apr. 3, 2018.

(30) Foreign Application Priority Data

Apr. 12, 2017  (CN) ............................ 2017 1 0236868

(51) Int. Cl.
    *H03M 1/66*    (2006.01)
    *H03M 1/08*    (2006.01)
    *H03F 3/45*    (2006.01)

(52) U.S. Cl.
    CPC ............ *H03M 1/0845* (2013.01); *H03F 3/45* (2013.01)

(58) Field of Classification Search
    CPC .............................. H03M 1/0845; H03F 3/45

(Continued)

(56) References Cited

U.S. PATENT DOCUMENTS 7,277,035 B1   10/2007  You et al.
7,812,641 B2 * 10/2010  Danesh ................ H04B 3/30
                                                          326/30

(Continued)

FOREIGN PATENT DOCUMENTS

CN        1574646 A     2/2005
CN      102394648 A    3/2012

(Continued)

OTHER PUBLICATIONS

Machine Translation and Abstract of Chinese Publication No. CN102394648, Mar. 28, 2012, 18 pages.
Machine Translation and Abstract of Chinese Publication No. CN102447476, May 9, 2012, 21 pages.
Machine Translation and Abstract of Chinese Publication No. CN106209098, Dec. 7, 2016, 16 pages.
Machine Translation and Abstract of Chinese Publication No. CN106559081, Apr. 5, 2017, 16 pages.

(Continued)

*Primary Examiner* — Peguy Jean Pierre
(74) *Attorney, Agent, or Firm* — Conley Rose, P.C.

(57) ABSTRACT

A digital-to-analog converter includes a first current source module configured to supply a current $I_1$ to the digital-to-analog converter, a first switch control module configured to control connection or disconnection between each branch and a trans-impedance amplifier in the digital-to-analog converter based on a to-be-converted digital signal, where the current $I_1$ supplied by the first current source module flows to the trans-impedance amplifier through a connected branch, and the trans-impedance amplifier is configured to convert the current $I_1$ supplied by the first current source module into an analog voltage and output the analog voltage.

15 Claims, 14 Drawing Sheets

(58) Field of Classification Search
USPC .......................................................... 341/144
See application file for complete search history.

(56) References Cited

U.S. PATENT DOCUMENTS

| | | | |
|---|---|---|---|
| 7,847,717 | B2 | 12/2010 | Mishra et al. |
| 2004/0232970 | A1 | 11/2004 | Mochizuki |
| 2008/0008262 | A1* | 1/2008 | Sobel ...................... H03F 3/087 |
| | | | 375/296 |
| 2013/0181856 | A1 | 7/2013 | Guo et al. |
| 2013/0241622 | A1 | 9/2013 | Zerbe et al. |
| 2015/0171811 | A1* | 6/2015 | Wu ...................... H03G 1/0088 |
| | | | 330/254 |

FOREIGN PATENT DOCUMENTS

| | | |
|---|---|---|
| CN | 102447476 A | 5/2012 |
| CN | 102545905 A | 7/2012 |
| CN | 106209098 A | 12/2016 |
| CN | 106559081 A | 4/2017 |
| EP | 1480343 A1 | 11/2004 |
| FR | 2744304 A1 | 8/1997 |
| JP | H09238078 A | 9/1997 |

OTHER PUBLICATIONS

Machine Translation and Abstract of Japanese Publication No. JPH09238078, Sep. 9, 1997, 13 pages.
Foreign Communication From A Counterpart Application, Chinese Application No. 201710236868.5, Chinese Office Action dated Dec. 17, 2019, 4 pages.
Foreign Communication From A Counterpart Application, Chinese Application No. 201710236868.5, Chinese Search Report dated Nov. 22, 2019, 2 pages.
Foreign Communication From A Counterpart Application, PCT Application No. PCT/CN2018/081772, English Translation of International Search Report dated Jul. 5, 2018, 2 pages.
Foreign Communication From A Counterpart Application, PCT Application No. PCT/CN2018/081772, English Translation of Written Opinion dated Jul. 5, 2018, 4 pages.
Machine Translation and Abstract of French Publication No. FR2744304, Aug. 1, 1997, 10 pages.
Clara, M., et al., "A 1.5V 13bit 130-300MS/s Self-calibrated DAG with Active Output Stage and 50MHz Signal Bandwidth in 0.13[mu]m CMOS," 2013 Proceedings of the ESSCIRC (ESSCIRC), XP055284623, Sep. 1, 2008, pp. 262-265.
Foreign Communication From A Counterpart Application, European Application No. 18783756.2, European Search Report dated Feb. 18, 2020, 12 pages.

* cited by examiner

US 10,998,912 B2

DIGITAL-TO-ANALOG CONVERTER TO REDUCE NOISE GENERATED BY A QUIESCENT CURRENT

CROSS-REFERENCE TO RELATED APPLICATIONS

This application is a continuation application of International Application No. PCT/CN2018/081772, filed on Apr. 3, 2018, which claims priority to Chinese Patent Application No. 201710236868.5, filed on Apr. 12, 2017, both of which are hereby incorporated by reference in their entireties.

TECHNICAL FIELD

This application relates to the circuit field, and more specifically, to a digital-to-analog converter.

BACKGROUND

A digital-to-analog converter can convert a discrete digital parameter into a continuously varying analog parameter, and is a component widely applied to the computer field, the communications field, and the like.

In a current technology, to achieve a relatively high analog signal output bandwidth and meet a requirement of low power consumption and a small area, a digital-to-analog converter based on a current steering structure has become a mainstream product.

Existing current steering structures are classified into structures of two types: a double-side switch type and a single-side switch type. In a structure of the double-side switch type, due to a relatively large quantity of switches, there is a mismatch between switch delays, causing dynamic performance degradation. In a structure of the single-side switch type, the switch delay problem is avoided, and power consumption is reduced. However, in the structure of the single-side switch type, there is a transfer switch only on a charging current (or a discharging current), the other side is two fixed quiescent discharging current sinks (or charging current sources), and a sum of two quiescent currents is equal to the current with the transfer switch. In an embodiment, to achieve an output signal amplitude the same as that in the structure of the double-side switch type, double quiescent current overheads are needed, and noise also exponentially increases.

SUMMARY

This application provides a digital-to-analog converter, to reduce noise generated by a quiescent current.

According to an aspect, a digital-to-analog converter is provided, and includes: a first current source module configured to supply a current $I_1$ to the digital-to-analog converter; a first switch control module configured to control connection or disconnection between each branch and a trans-impedance amplifier in the digital-to-analog converter based on a to-be-converted digital signal, where the current $I_1$ supplied by the first current source module flows to the trans-impedance amplifier through a connected branch; and the trans-impedance amplifier configured to: convert the current $I_1$ supplied by the first current source module into an analog voltage, and output the analog voltage.

Therefore, in this embodiment of this application, a second current source module is removed such that a quiescent current fully flows through the trans-impedance amplifier, thereby reducing noise generated by the quiescent current in the digital-to-analog converter. Compared with a current steering structure of a single-side switch type in other approaches, the solution in this embodiment reduces the quiescent current such that noise generated by the quiescent current is greatly reduced when a same output signal amplitude is ensured and circuit complexity is not increased. In addition, compared with a current steering structure of a double-side switch type, the solution in this embodiment greatly reduces power consumption caused by the quiescent current.

Optionally, a common-mode voltage of output ends of the trans-impedance amplifier is different from a common-mode voltage of input ends of the trans-impedance amplifier.

Because the quiescent current is not removed using the second current source module, the quiescent current fully flows through the trans-impedance amplifier, in other words, the quiescent current is fully retained. Therefore, the common-mode voltage of the input ends of the trans-impedance amplifier is different from the common-mode voltage of the output ends of the trans-impedance amplifier.

Optionally, the first current source module includes N first current sources respectively configured in N current steering structures, and the first switch control module includes N first switch groups respectively configured in the N current steering structures and N second switch groups respectively configured in the N current steering structures, where a first end of an $i^{th}$ first switch group in the N first switch groups and a first end of an $i^{th}$ second switch group in the N second switch groups are both connected to an $i^{th}$ first current source in the N current sources, a second end of each of the N first switch groups is connected to a first input end of the trans-impedance amplifier, a second end of each of the N second switch groups is connected to a second input end of the trans-impedance amplifier, the current $I_1$ supplied by the first current source module is a sum of currents supplied by the N first current sources, $i \in [1, N]$, and both i and N are natural numbers greater than or equal to 1.

In an embodiment, the digital-to-analog converter in this embodiment of this application includes a digital-to-analog converter configured to convert a single-bit digital signal and a digital-to-analog converter configured to convert a multi-bit digital signal.

Optionally, each first switch group includes at least one P-type metal-oxide-semiconductor (MOS) field-effect MOS transistor, each second switch group includes at least one P-type MOS transistor, a first end of the first switch group and a first end of the second switch group respectively correspond to sources of the P-type MOS transistors, and the second end of the first switch group and the second end of the second switch group respectively correspond to drains of the P-type MOS transistors.

Optionally, the first current source module includes R first current sinks respectively configured in R current steering structures, and the first switch control module includes R third switch groups respectively configured in the R current steering structures and R fourth switch groups respectively configured in the R current steering structures, whereas first end of an $x^{th}$ third switch group in the R third switch groups and a first end of an $x^{th}$ fourth switch group in the R fourth switch groups are both connected to an $x^{th}$ first current sink in the R first current sinks, a second end of each of the R third switch groups is connected to a first input end of the trans-impedance amplifier, a second end of each of the R fourth switch groups is connected to a second input end of the trans-impedance amplifier, the current $I_1$ supplied by the first current source module is a sum of currents supplied by the R first current sinks, x∈[1, R], and both x and R are natural numbers greater than or equal to 1.

In an embodiment, the digital-to-analog converter in this embodiment of this application includes a digital-to-analog converter configured to convert a single-bit digital signal and a digital-to-analog converter configured to convert a multi-bit digital signal.

Optionally, each third switch group includes at least one N-type MOS transistor, each fourth switch group includes at least one N-type MOS transistor, a first end of the third switch group and a first end of the fourth switch group respectively correspond to sources of the N-type MOS transistors, and the second end of the third switch group and the second end of the fourth switch group respectively correspond to drains of the N-type MOS transistors.

According to another aspect, a digital-to-analog converter is provided, and includes a first current source module configured to supply a current $I_1$ to the digital-to-analog converter; a first switch control module configured to control connection or disconnection between each branch and a trans-impedance amplifier in the digital-to-analog converter based on a to-be-converted digital signal, where the current $I_1$ supplied by the first current source module flows to a second current source module and the trans-impedance amplifier through a connected branch; the second current source module configured to regulate a quiescent current $I_2$ flowing through the second current source module, to control a common-mode current flowing through the trans-impedance amplifier; and the trans-impedance amplifier configured to: convert the current flowing through the trans-impedance amplifier into an analog voltage, and output the analog voltage, where the current $I_1$ supplied by the first current source module and the quiescent current $I_2$ flowing through the second current source module meet $0 \leq I_2 < I_1$.

Therefore, in this embodiment of this application, the second current source module is adjusted such that the quiescent current flowing through the second current source module is reduced and even is 0, to reduce noise generated by the quiescent current in the digital-to-analog converter. Compared with a current steering structure of a single-side switch type in other approaches, the solution in this embodiment reduces the quiescent current such that noise generated by the quiescent current is greatly reduced when a same output signal amplitude is ensured and circuit complexity is not increased. In addition, compared with a current steering structure of a double-side switch type, the solution in this embodiment greatly reduces power consumption caused by the quiescent current.

Optionally, a common-mode voltage of output ends of the trans-impedance amplifier is different from a common-mode voltage of input ends of the trans-impedance amplifier.

Because the quiescent current is partially removed using the second current source module or the quiescent current is not removed, the quiescent current partially or fully flows through the trans-impedance amplifier, in other words, the quiescent current is not fully removed or the quiescent current is fully retained. Therefore, the common-mode voltage of the input ends of the trans-impedance amplifier is different from the common-mode voltage of the output ends of the trans-impedance amplifier.

Optionally, the first current source module includes N first current sources respectively configured in N current steering structures, and the first switch control module includes N first switch groups respectively configured in the N current steering structures and N second switch groups respectively configured in the N current steering structures, where a first end of an $i^{th}$ first switch group in the N first switch groups and a first end of an $i^{th}$ second switch group in the N second switch groups are both connected to an $i^{th}$ first current source in the N current sources, a second end of each of the N first switch groups is connected to a first input end of the trans-impedance amplifier, a second end of each of the N second switch groups is connected to a second input end of the trans-impedance amplifier, the current $I_1$ supplied by the first current source module is a sum of currents supplied by the N first current sources, i∈[1, N], and both i and N are natural numbers greater than or equal to 1.

In an embodiment, the digital-to-analog converter in this embodiment of this application includes a digital-to-analog converter configured to convert a single-bit digital signal and a digital-to-analog converter configured to convert a multi-bit digital signal.

Optionally, the second current source module includes M first controllable current sinks connected to the first input end of the trans-impedance amplifier and M second controllable current sinks connected to the second input end of the trans-impedance amplifier; and the quiescent current $I_2$ flowing through the second current source module is a sum of currents flowing through the M first controllable current sinks and currents flowing through the M second controllable current sinks, and M is a natural number greater than or equal to 1.

Optionally, each of the M first controllable current sinks includes a fifth switch group and a second current sink, and each of the M second controllable current sinks includes a sixth switch group and a third current sink; in a $j^{th}$ first controllable current sink in the M first controllable current sinks, the fifth switch group is configured to control connection or disconnection between the second current sink and each of the first current source module and the trans-impedance amplifier, in a $j^{th}$ second controllable current sink in the M second controllable current sinks, the sixth switch group is configured to control connection or disconnection between the third current sink and each of the first current source module and the trans-impedance amplifier, j∈[1, M], and j is a natural number; when fifth switch groups of the M first controllable current sinks and sixth switch groups of the M second controllable current sinks are all in an open state, the quiescent current $I_2$ flowing through the second current source module is equal to 0; and when a fifth switch group of at least one of the M first controllable current sinks is in a closed state and a sixth switch group of at least one of the M second controllable current sinks is in the closed state, the quiescent current $I_2$ flowing through the second current source module and the current $I_1$ supplied by the first current source module meet $0 < I_2 < I_1$.

Optionally, each first switch group includes at least one P-type field-effect MOS transistor, each second switch group includes at least one P-type MOS transistor, a first end of the first switch group and a first end of the second switch group respectively correspond to sources of the P-type MOS transistors, and the second end of the first switch group and the second end of the second switch group respectively correspond to drains of the P-type MOS transistors.

Optionally, the first current source module includes R first current sinks respectively configured in R current steering structures, and the first switch control module includes R third switch groups respectively configured in the R current steering structures and R fourth switch groups respectively configured in the R current steering structures, whereas first end of an $x^{th}$ third switch group in the R third switch groups and a first end of an $x^{th}$ fourth switch group in the R fourth switch groups are both connected to an $x^{th}$ first current sink in the R first current sinks, a second end of each of the R third switch groups is connected to a first input end of the trans-impedance amplifier, a second end of each of the R fourth switch groups is connected to a second input end of the trans-impedance amplifier, the current $I_1$ supplied by the first current source module is a sum of currents supplied by the R first current sinks, $x \in [1, R]$, and both x and R are natural numbers greater than or equal to 1.

In an embodiment, the digital-to-analog converter in this embodiment of this application includes a digital-to-analog converter configured to convert a single-bit digital signal and a digital-to-analog converter configured to convert a multi-bit digital signal.

Optionally, the second current source module includes S first controllable current sources connected to the first input end of the trans-impedance amplifier and S second controllable current sources connected to the second input end of the trans-impedance amplifier; and the quiescent current $I_2$ flowing through the second current source module is a sum of currents flowing through the S first controllable current sources and currents flowing through the S second controllable current sources, and S is a natural number greater than or equal to 1.

Optionally, each of the S first controllable current sources includes a seventh switch group and a second current source, and each of the S second controllable current sources includes an eighth switch group and a third current source; in a $y^{th}$ first controllable current source in the S first controllable current sources, the seventh switch group is configured to control connection or disconnection between the second current source and each of the first current source module and the trans-impedance amplifier, in a $y^{th}$ second controllable current source in the S second controllable current sources, the eighth switch group is configured to control connection or disconnection between the third current source and each of the first current source module and the trans-impedance amplifier, $y \in [1, S]$, and y is a natural number; when seventh switch groups of the S first controllable current sources and eighth switch groups of the S second controllable current sources are all in an open state, the quiescent current $I_2$ flowing through the second current source module is equal to 0; and when a seventh switch group of at least one of the S first controllable current sources is in a closed state and an eighth switch group of at least one of the S second controllable current sources is in the closed state, the quiescent current $I_2$ flowing through the second current source module and the current $I_1$ supplied by the first current source module meet $0 < I_2 < I_1$.

Optionally, each third switch group includes at least one N-type MOS transistor, each fourth switch group includes at least one N-type MOS transistor, a first end of the third switch group and a first end of the fourth switch group respectively correspond to sources of the N-type MOS transistors, and the second end of the third switch group and the second end of the fourth switch group respectively correspond to drains of the N-type MOS transistors.

It should be understood that the P-type MOS transistor and the N-type MOS transistor in the foregoing examples are merely for illustration purposes, and should not constitute any limitation to this application, and this application should not be limited thereto.

In the embodiments of this application, the second current source module is adjusted such that the quiescent current flowing through the second current source module is reduced and even is 0, or the second current source module is removed, to reduce noise generated by the quiescent current in the digital-to-analog converter. Therefore, noise generated by the quiescent current is greatly reduced when an output signal amplitude the same as that in an existing current steering structure of a single-side switch type is ensured and circuit complexity is not increased.

DESCRIPTION OF EMBODIMENTS

The following describes technical solutions of this application with reference to the accompanying drawings.

Figure 1:
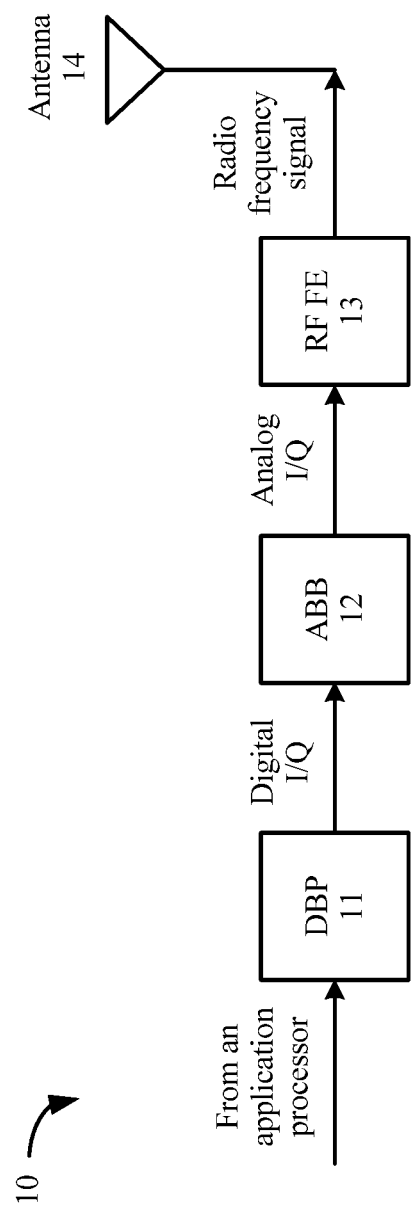
FIG. 1 is a schematic block diagram of a system to which a digital-to-analog converter in embodiments of this application is applicable.

FIG. 1 is a schematic diagram of a system 10 to which a digital-to-analog converter in the embodiments of this application is applicable. As shown in FIG. 1, the system 10 includes a digital baseband module (also referred to as a digital baseband processor (DBP)) 11, an analog baseband module (also referred to as an analog baseband chip (ABB)) 12, a radio frequency front end (RF FE) 13, and an antenna 14. The DBP 11 receives, from an application processor, data that needs to be communicated, performs digital baseband processing on the data to obtain a quadrature digital baseband in-phase/quadrature (I/Q) signal, and outputs the digital baseband I/Q signal to the ABB 12. A digital-to-analog converter described below in detail with reference to FIG. 2) in the ABB 12 performs digital-to-analog conversion on the digital baseband I/Q signal to obtain an analog baseband I/Q signal, and sends the analog baseband I/Q signal to the RF FE 13. The RF FE 13 performs quadrature modulation on the analog baseband I/Q signal to obtain a modulated analog baseband I/Q signal, and up converts the modulated analog baseband I/Q signal to a radio frequency band to obtain a radio frequency signal. Finally, the antenna 14 sends the radio frequency signal.

Figure 2:
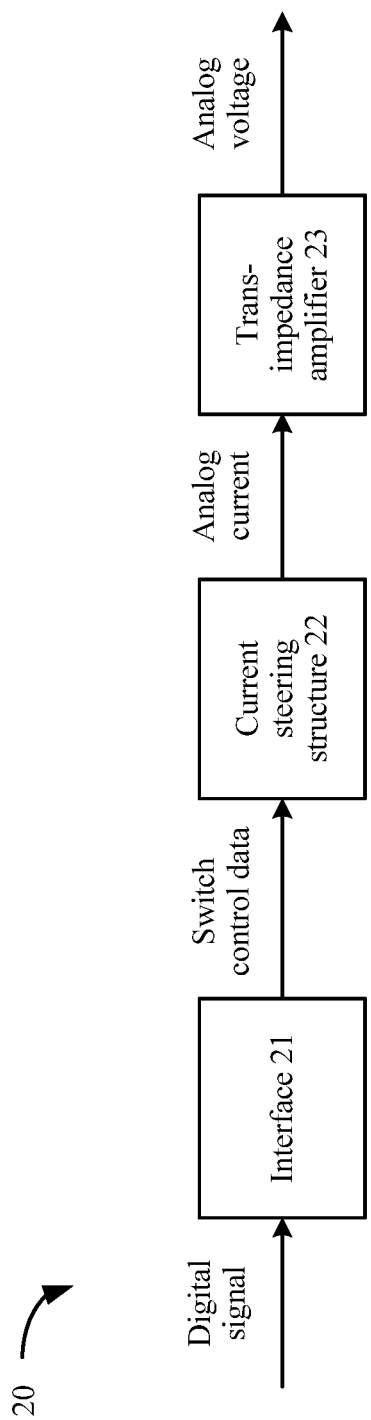
FIG. 2 is a schematic block diagram of a digital-to-analog converter.

FIG. 2 is a schematic block diagram of a digital-to-analog converter 20. As shown in FIG. 2, the digital-to-analog converter 20 includes a digital-to-analog interface 21, a current steering structure 22, and a trans-impedance amplifier 23. The digital-to-analog interface 21 may preprocess, for example, align and transcode, a received digital signal (which is a digital baseband I/Q signal), to generate a to-be-converted digital signal (namely, switch control data). After receiving the to-be-converted digital signal, the current steering structure 22 may control connection or disconnection between each branch of the current steering structure and the trans-impedance amplifier based on a specific value of the digital signal such that current signals on different branches flow through the trans-impedance amplifier 23. Then, an analog current signal flowing through the trans-impedance amplifier is converted into an analog voltage signal using a resistor connected in parallel between an input end and an output end of the trans-impedance amplifier 23, and the analog voltage signal is output to a radio frequency transceiver.

Figure 3:
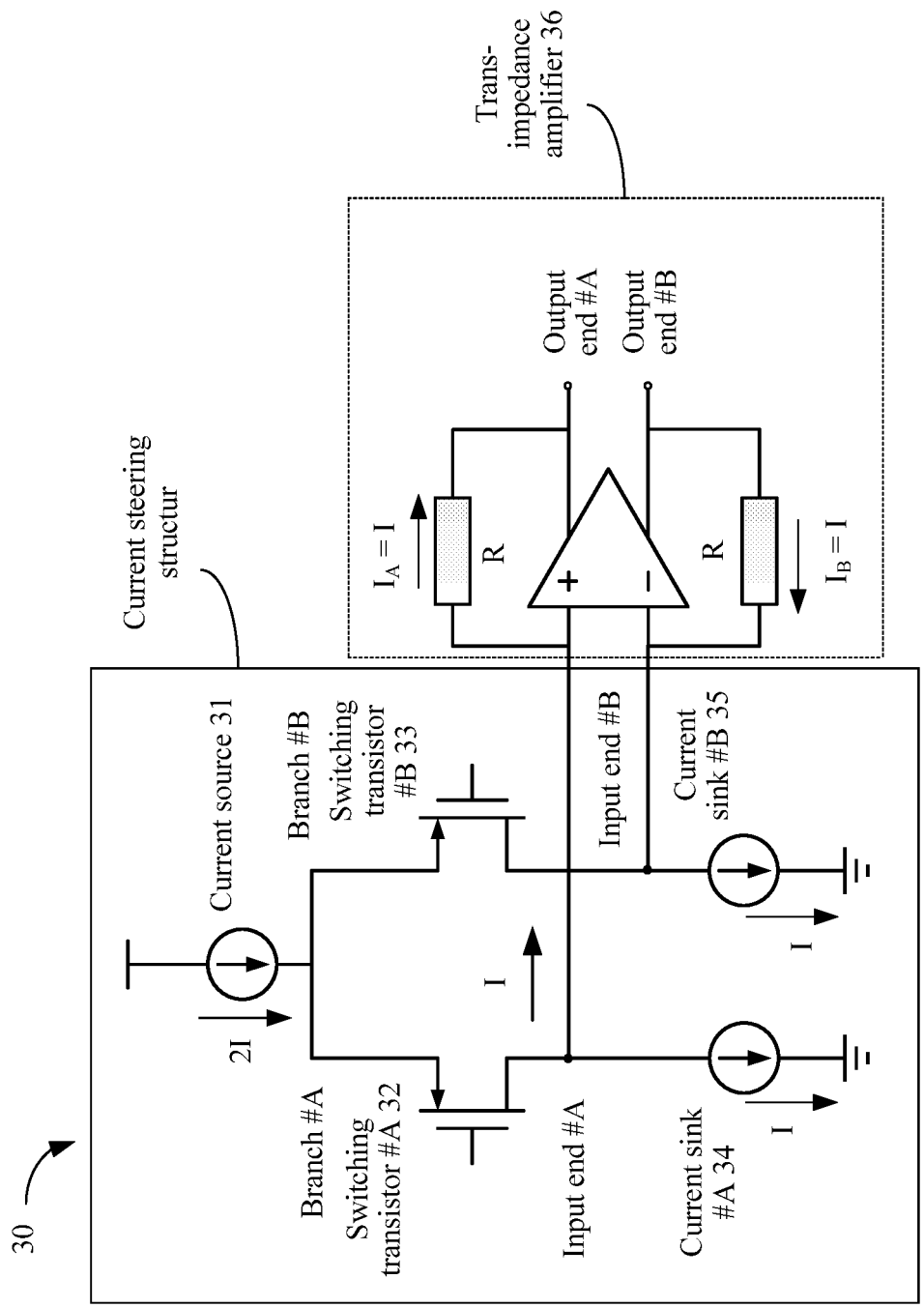
FIG. 3 is a schematic structural diagram of a digital-to-analog converter having a current steering structure of a single-side switch type.

In a current technology, current steering structures mainly include structures of two types: a double-side switch type and a single-side switch type. FIG. 3 is a schematic structural diagram of a digital-to-analog converter having a current steering structure of a single-side switch type. As shown in FIG. 3, the digital-to-analog converter 30 includes a current source 31, a switching transistor #A 32, a switching transistor #B 33, a current sink #A 34, a current sink #B 35, and a trans-impedance amplifier 36. The current source 31, the switching transistor #A 32, the switching transistor #B 33, the current sink #A 34, and the current sink #B 35 form a current steering structure. The current source 31 is configured to supply an input current to two branches (denoted as, for example, a branch #1 and a branch #2) of the current steering structure. The switching transistor #A 32 and the current sink #A 34 are configured on one (which may be, for example, the branch #1) of the two branches. The switching transistor #B 33 and the current sink #B 35 are configured on the other (which may be, for example, the branch #2) of the two branches. The current sinks (including the current sink #A 34 and the current sink #B 35) are configured to extract a quiescent current (also referred to as a common-mode signal) in the current input by the current source 31, in other words, the current sinks are grounded. Two input ends (denoted as, for example, an input end #A and an input end #B) of the trans-impedance amplifier 36 are respectively connected to a point between the switching transistor #A 32 and the current sink #A 34 on the branch #A and a point between the switching transistor #B 33 and the current sink #B 35 on the branch #B. The trans-impedance amplifier 36 is configured to convert a current flowing through the trans-impedance amplifier 36 into an analog voltage.

A person skilled in the art may understand that when a gain of the trans-impedance amplifier is high enough, voltages of the two input ends of the trans-impedance amplifier are basically the same, in an embodiment, there is a virtual short circuit between the two input ends.

In the current steering structure shown in FIG. 3, because the common-mode current in the current input by the current source is fully extracted using the current sinks (including the current sink #A and the current sink #B), all signals flowing through the trans-impedance amplifier are differential-mode currents. In this case, a common-mode voltage of the input ends of the trans-impedance amplifier is the same as a common-mode voltage of output ends of the trans-impedance amplifier.

It should be noted that common-mode signals may be understood as signals having a same amplitude and a same phase, and differential-mode signals may be understood as signals having a same amplitude and opposite phases. It is assumed that two differential signals are $V_A$ and $V_B$. In this case, a common-mode signal is a part commonly owned by the two signals, in an embodiment, $V_{com}=(V_A+V_B)/2$, and differential-mode signals are parts respectively owned by the two signals, in an embodiment, for $V_A$, $V_{Adiff}=(V_A-V_B)/2$, and for $V_B$, $V_{Bdiff}=-(V_A-V_B)/2$. Further, in the current steering structure shown in FIG. 3, it is assumed that the input current supplied by the current source is 2I, the switching transistor #A is closed, and the switching transistor #B is open, in other words, the branch #A is closed, and the branch #B is open. In this case, a current flowing to the trans-impedance amplifier through the branch #A via the input end #A is I, and a quiescent current flowing to the current sink #A through the branch #A is also I. To ensure that a quiescent current flowing through the current sink #B is the same as the quiescent current flowing through the current sink #A, a quiescent current I flows to the current sink #B through the input end #B of the trans-impedance amplifier. It can be seen from FIG. 3 that currents flowing through the two input ends of the trans-impedance amplifier have a same value and opposite directions. It is assumed that the voltages of the input ends of the trans-impedance amplifier are $V_0$, and a resistance of the trans-impedance amplifier is R. In this case, the common-mode voltage of the input ends of the trans-impedance amplifier is $V_0$, a voltage of one output end (denoted as, for example, an output end #A) that is of the trans-impedance amplifier and that corresponds to the branch #A is $V_0-IR$, a voltage of the other output end (denoted as, for example, an output end #B) that is of the trans-impedance amplifier and that corresponds to the branch #B is $V_0+IR$, and the common-mode voltage of the output ends of the trans-impedance amplifier is $(V_0-IR+V_0+IR)/2=V_0$. An analog voltage output by the trans-impedance amplifier is a difference between the voltages of the two output ends, in an embodiment, "2IR" or "−2IR", respectively corresponding to a digital signal "1" or "0".

It should be noted that any two variables may be decomposed into a common-mode component and differential-mode components. In this embodiment of this application, currents (denoted as, for example, $I_A$ and $I_B$) flowing through the trans-impedance amplifier through the input end #A and the input end #B may be decomposed into a common-mode current and differential-mode currents, the common-mode current is $(I_A+I_B)/2$, and a differential-mode current is $(I_A-I_B)/2$. Generally, the common-mode current does not change, and different analog voltages are output by changing the different-mode currents, to indicate different digital signals.

It should be further noted that the quiescent current may be understood as a constant current in the current steering structure. In the digital-to-analog converter (namely, the digital-to-analog converter shown in FIG. 3), the quiescent current is a common-mode current. In an embodiment, the quiescent current is fully extracted using the current sinks, and only the differential-mode currents flow through the trans-impedance amplifier, to obtain an analog voltage.

It should be understood that a correspondence between an analog voltage and a digital signal in the foregoing example is merely for an illustration purpose, and should not constitute any limitation to this application. For brevity, descriptions of a same or similar case are omitted below.

It can be learned from the foregoing descriptions that in the current steering structure of the single-side switch type, a value of the current flowing from the current source is the same as a value of currents flowing out of the current sinks (including the current sink #A and the current sink #B) and both values are 2I, and the quiescent currents flowing through the current sinks (including the current sink #A and the current sink #B) are 2I. As a result, relatively high quiescent current overheads are caused, and relatively high noise is generated.

In view of this, this application provides a digital-to-analog converter, to make improvement based on a current steering structure of a single-side switch type, to reduce quiescent current overheads, thereby reducing noise generated by a quiescent current.

The following describes in detail the digital-to-analog converter in the embodiments of this application with reference to FIG. 4 to FIG. 15. It should be understood that no digital-to-analog interface is shown in digital-to-analog converters shown in FIG. 4 to FIG. 15, but this should not constitute any limitation to this application. In the embodiments of this application, a received baseband digital signal may be preprocessed using a digital-to-analog interface in other approaches or a digital-to-analog interface that may appear in the future, and this is not the core of this application. For brevity, details are not described herein.

It should be noted that digital-to-analog converters in the embodiments of this application may be classified into a first-type digital-to-analog converter and a second-type digital-to-analog converter. A difference between the second-type digital-to-analog converter and the first-type digital-to-analog converter is that the first-type digital-to-analog converter supplies a forward current $I_1$ using a current source and the second-type digital-to-analog converter supplies a reverse current $I_1$ using a current sink. Therefore, a direction of a current flowing through a switching transistor in the second-type digital-to-analog converter is opposite to a direction of a current flowing through a switching transistor in the first-type digital-to-analog converter.

Figure 10:
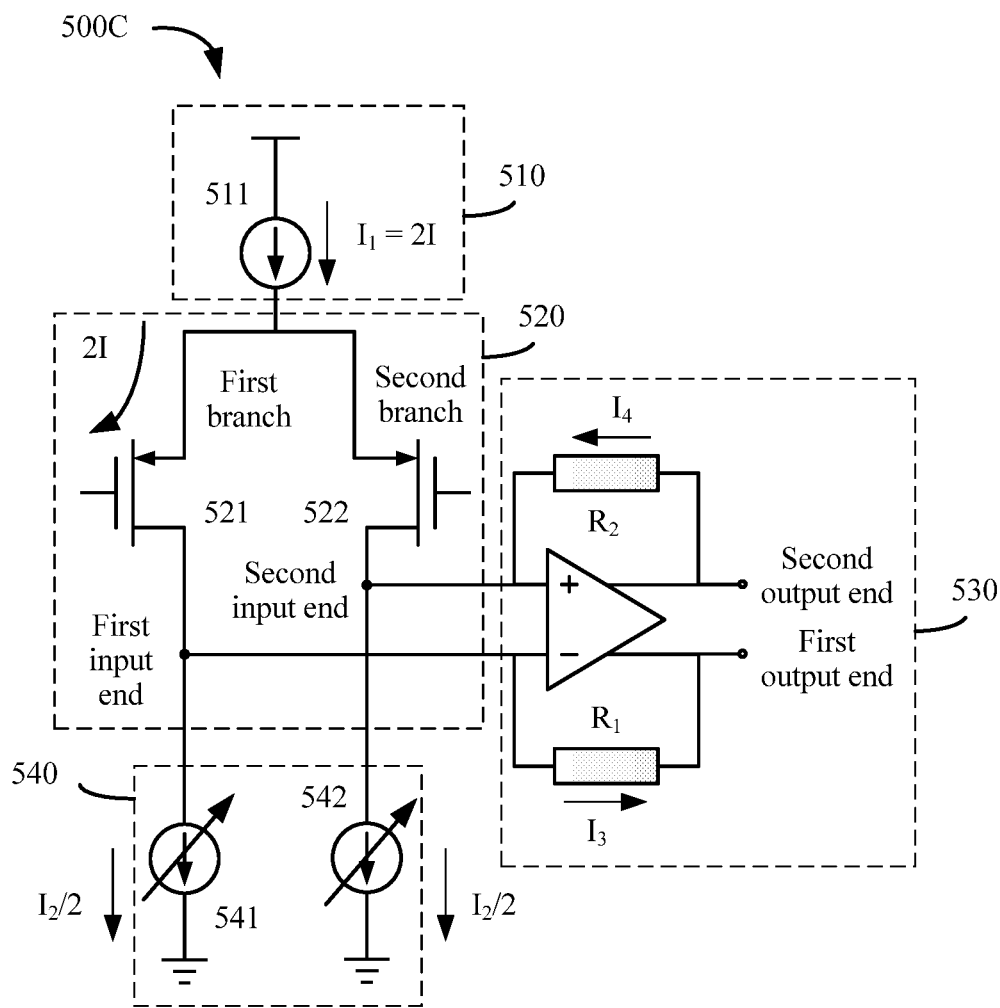
FIG. 10 is a schematic structural diagram of a digital-to-analog converter according to another embodiment of this application.
Figure 11:
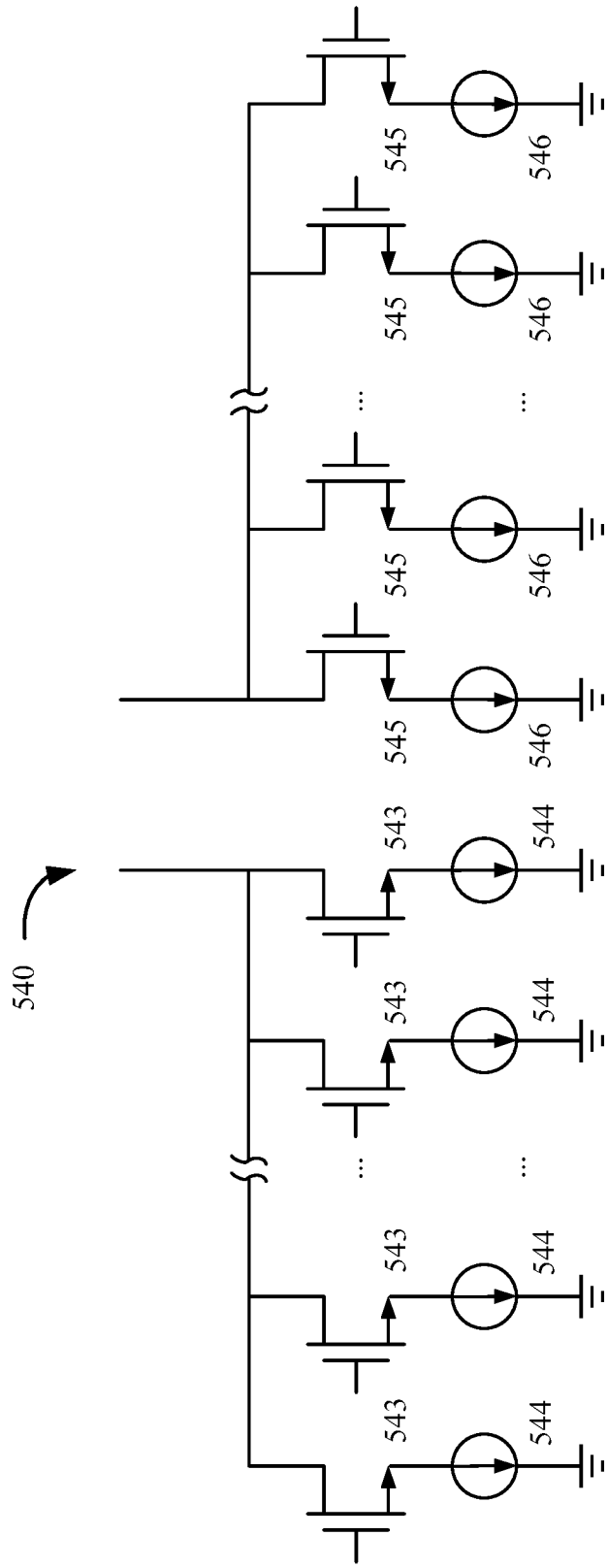
FIG. 11 is a schematic structural diagram of a second current source module in a digital-to-analog converter according to another embodiment of this application.
Figure 12:
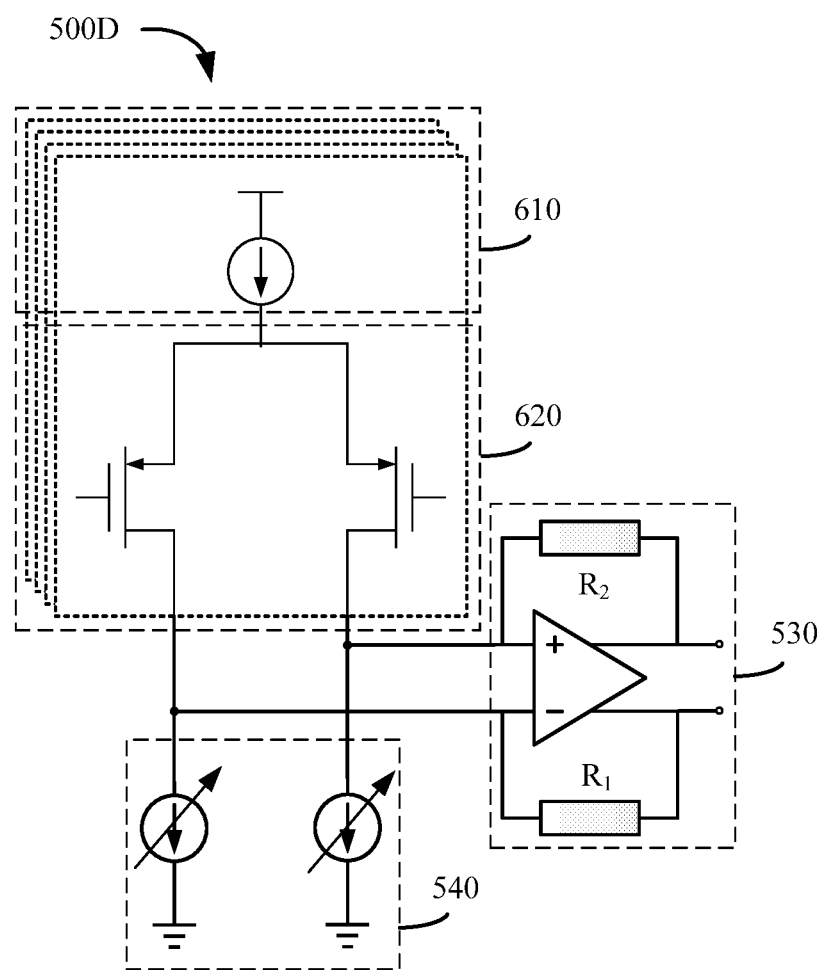
FIG. 12 is another schematic structural diagram of a digital-to-analog converter according to another embodiment of this application.

Further, in the first-type digital-to-analog converter, a quiescent current may not be extracted, in other words, the quiescent current fully flows through a trans-impedance amplifier (case 1, corresponding to FIG. 5 and FIG. 6); or a quiescent current $I_2$ may be partially extracted (case 3, corresponding to FIG. 10 to FIG. 12). In the second-type digital-to-analog converter, a quiescent current may not be extracted, in other words, the quiescent current fully flows through a trans-impedance amplifier (case 2, corresponding to FIG. 7 and FIG. 8); or a quiescent current $I_2$ may be partially extracted (case 4, corresponding to FIG. 13 to FIG. 15).

For ease of understanding the embodiments of this application, the following describes, in detail with reference to FIG. 4 to FIG. 8, cases (including case 1 and case 2) in which a second current source module is removed.

In case 1 and case 2, a current sink #A and a current sink #B in a digital-to-analog converter (for example, the digital-to-analog converter shown in FIG. 3) in other approaches are removed, or a module configured to extract a quiescent current (which may correspond to the second current source module described below in this application) is removed.

Figure 4:
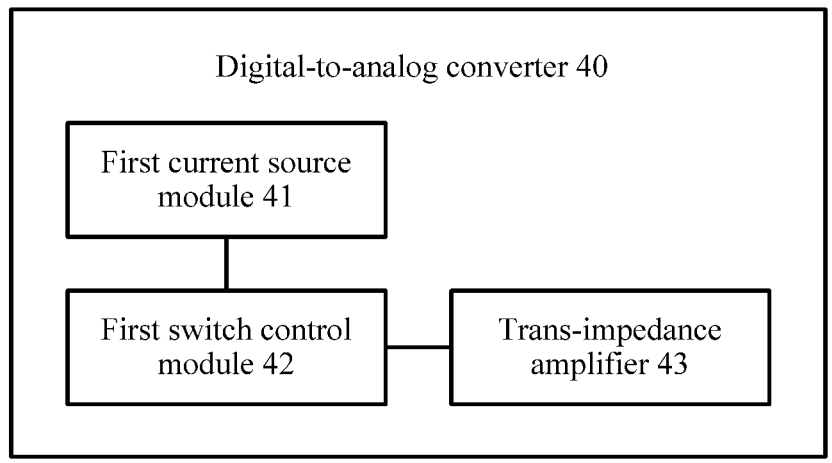
FIG. 4 is a schematic block diagram of a digital-to-analog converter according to an embodiment of this application.

FIG. 4 is a schematic block diagram of a digital-to-analog converter 40 according to an embodiment of this application. As shown in FIG. 4, the digital-to-analog converter 40 includes a first current source module 41, a first switch control module 42, and a trans-impedance amplifier 43. The first current source module 41 and the first switch control module 42 form a current steering structure. The first current source module 41 is configured to supply a current $I_1$ to the current steering structure. The first switch control module 42 is configured to control connection or disconnection between each branch of the current steering structure and the trans-impedance amplifier 43 based on a to-be-converted digital signal, or control connection or disconnection of each branch connected between the first current source module 41 and the trans-impedance amplifier 43 based on a to-be-converted digital signal. The trans-impedance amplifier 43 is configured to: convert a current (which may be understood as the current $I_1$ supplied by the first current source module 41) flowing through the trans-impedance amplifier 43 into an analog voltage, and output the analog voltage. Therefore, the digital-to-analog converter completes conversion from the digital signal to an analog signal.

It should be noted that the first current source module 41 may correspond to the current source 31 in the digital-to-analog converter 30 in FIG. 3, the first switch control module 42 may correspond to the switching transistor #A 32 and the switching transistor #B 33 in the digital-to-analog converter 30 in FIG. 3, and the trans-impedance amplifier 43 may correspond to the trans-impedance amplifier 36 in the digital-to-analog converter 30 in FIG. 3. It should be understood that herein, merely for ease of understanding, the digital-to-analog converter 40 in this embodiment of this application is described with reference to the modules in the digital-to-analog converter shown in FIG. 3, but this should not constitute any limitation to this application. For example, the first switch control module may include more switching transistors connected in parallel. The following describes in detail case 1 and case 2.

It should be noted that the digital-to-analog converter usually may implement conversion from a multi-bit digital signal to an analog signal through simultaneous reversal of a plurality of current steering structures. For ease of understanding, a digital-to-analog converter used for a single-bit digital signal is first described below, and a digital-to-analog converter used for a multi-bit digital signal is described below in detail using a digital-to-analog converter used for a 2-bit digital signal as an example.

Case 1:

Optionally, in the first-type digital-to-analog converter, the first current source module includes N first current sources respectively configured in N current steering structures, and the first switch control module includes N first switch groups respectively configured in the N current steering structures and N second switch groups respectively configured in the N current steering structures. A first end of an $i^{th}$ first switch group in the N first switch groups and a first end of an $i^{th}$ second switch group in the N second switch groups are both connected to an $i^{th}$ first current source in the N current sources, a second end of each of the N first switch groups is connected to a first input end of the trans-impedance amplifier, a second end of each of the N second switch groups is connected to a second input end of the trans-impedance amplifier, the current $I_1$ supplied by the first current source module is a sum of currents supplied by the N first current sources, i∈[1, N], and both i and N are natural numbers greater than or equal to 1.

Figure 5:
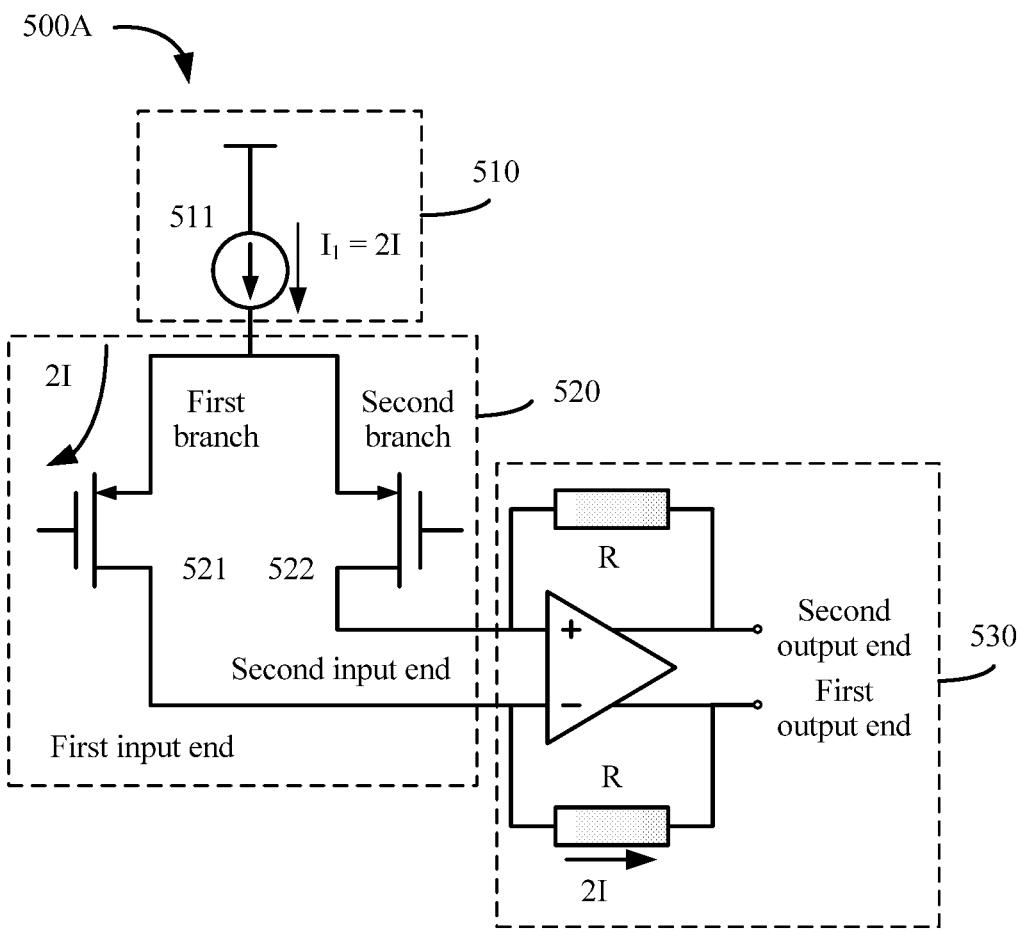
FIG. 5 is a schematic structural diagram of a digital-to-analog converter according to an embodiment of this application.

FIG. 5 is a schematic structural diagram of a digital-to-analog converter 500A according to an embodiment of this application. Further, FIG. 5 shows an example of a digital-to-analog converter used for a single-bit digital signal, in an embodiment, N=1. As shown in FIG. 5, the digital-to-analog converter 500A includes a first current source module 510, a first switch control module 520, and a trans-impedance amplifier 530. The first current source module 510 includes a first current source 511, and the first switch control module 520 includes a first switch group 521 and a second switch group 522. The first current source module 510 and the first switch control module 520 form a current steering structure. The current steering structure may include two branches (denoted as, for example, a first branch and a second branch). The first current source 511 is connected to both the first switch group 521 configured on the first branch and the second switch group 522 configured on the second branch. The first switch group 521 is connected to a first input end of the trans-impedance amplifier 530, and the second switch group 522 is connected to a second input end of the trans-impedance amplifier 530. In an embodiment, the first switch control module 520 controls connection or disconnection between the first current source module 510 and the trans-impedance amplifier 530 on the first branch using the first switch group 521, and the first switch control module 520 controls connection or disconnection between the first current source module and the trans-impedance amplifier 530 on the second branch using the second switch group 522.

Each switch group of the first switch control module includes at least one switching transistor. Optionally, by way of example rather than limitation, the switching transistor is a field-effect MOS transistor.

Further, in this embodiment of this application, the MOS transistor may be a P-type MOS transistor. In the first switch group, a source of each MOS transistor is connected to (or corresponds to) a first end of the first switch group, and a drain of each MOS transistor is connected to a second end of the first switch group. In the second switch group, a source of each MOS transistor is connected to a first end of the second switch group, and a drain of each MOS transistor is connected to a second end of the second switch group. The first end of the first switch group is connected to the first current source, and the second end of the first switch group is connected to the first input end of the trans-impedance amplifier. The first end of the second switch group is connected to the first current source, and the second end of the second switch group is connected to the second input end of the trans-impedance amplifier.

It is assumed that a current $I_1$ supplied by the first current source is 2I, the first switch group is in a closed state, and the second switch group is in an open state. In this case, the 2I current flows to the trans-impedance amplifier through the first branch via the first switch group and the first input end of the trans-impedance amplifier. As described above, there is a virtual short circuit between the two input ends of the trans-impedance amplifier. It is assumed that both input voltages are $V_0$, and a resistance of the trans-impedance amplifier is R. In this case, a voltage of a first output end that is of the trans-impedance amplifier and that corresponds to the first branch is $V_1=V_0-2IR$, and a voltage of a second output end that is of the trans-impedance amplifier and that corresponds to the second branch is $V_2=V_0$.

It can be learned from the foregoing descriptions that corresponding to a digital signal "1" or "0", the trans-impedance amplifier outputs a different analog voltage. It can be learned from the foregoing descriptions that a common-mode voltage is an average of two voltages, in an embodiment, a common-mode voltage of the output ends of the trans-impedance amplifier is $V_{com}=V_0-IR$. In this case, the voltage of the first output end that is of the trans-impedance amplifier and that corresponds to the first branch is $V_1=V_{com}-IR$, and the voltage of the second output end that is of the trans-impedance amplifier and that corresponds to the second branch is $V_2=V_{com}+IR$, in an embodiment, a differential-mode voltage is $V_1-V_{com}=-(V_2-V_{com})$.

Similarly, if the second switch group is in the closed state, and the first switch group is in the open state, the second branch is closed, the first branch is open, and voltages output by the first output end and the second output end of the trans-impedance amplifier are respectively $V_1=V_{com}+IR$ and $V_2=V_{com}-IR$, in an embodiment, $V_1-V_{com}=-(V_2-V_{com})$.

Therefore, it can be learned that a common-mode voltage of the input ends of the trans-impedance amplifier is different from the common-mode voltage of the output ends of the trans-impedance amplifier. Although a quiescent current is not removed using a current sink, an expected analog voltage can still be obtained using the trans-impedance amplifier matching the different common-mode voltages of the input ends and the output ends, to indicate a different digital signal.

Figure 6:
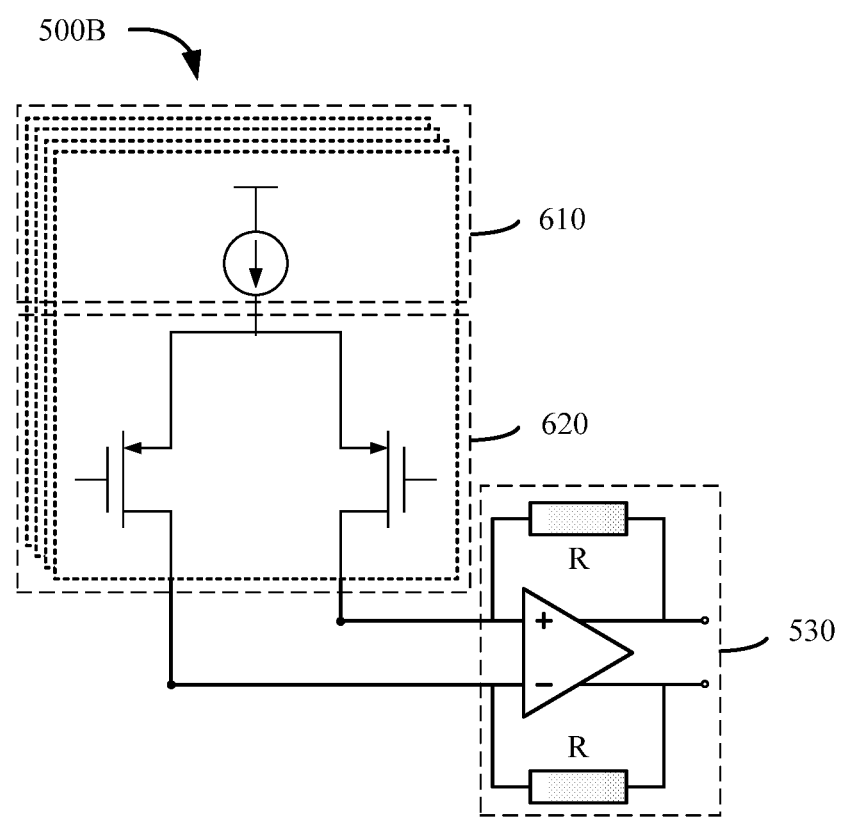
FIG. 6 is another schematic structural diagram of a digital-to-analog converter according to an embodiment of this application.

FIG. 6 is another schematic structural diagram of a digital-to-analog converter 500B according to an embodiment of this application. Further, FIG. 6 shows an example of a digital-to-analog converter used for a multi-bit digital signal, in an embodiment, N>1. As shown in FIG. 6, the digital-to-analog converter 500B includes a first current source module 610, a first switch control module 620, and a trans-impedance amplifier 530. The first current source module 610 includes N first current sources 511 shown in FIG. 5 that are respectively configured in N current steering structures, and the first switch control module 620 includes N first switch groups 521 shown in FIG. 5 that are respectively configured in the N current steering structures and N second switch groups 522 shown in FIG. 5 that are respectively configured in the N current steering structures. In other words, each current steering includes a first current source, a first switch group, and a second switch group. The N current steering structures form a current steering structure, and each current steering may be understood as one unit of the current steering structure. The current steering structure may include two branches (for example, a first branch and a second branch).

Further, in a $j^{th}$ current steering in the N current steering structures, a first end of a first switch group and a first end of a second switch group are both connected to a first current source. Second ends of the N first switch groups are all connected to a first input end of the trans-impedance amplifier, and second ends of the N second switch groups are all connected to a second input end of the trans-impedance amplifier. In an embodiment, the first switch group in each current steering is configured on the first branch, the second switch group in each current steering is configured on the second branch, the first input end of the trans-impedance amplifier is connected to the first branch, and the second input end of the trans-impedance amplifier is connected to the second branch.

Because the N first current sources in the N current steering structures jointly supply currents, a current $I_1$ supplied by the first current source module 610 is a sum of the currents supplied by the N first current sources. It is assumed that each first current source supplies a 2I current. In this case, a value of a current output by the first current source module can be regulated in a range of [0, 2NI] by controlling closure or openness of the N first switch groups and the N second switch groups.

It should be understood that functions of the first current source, the first switch group, and the second switch group in each current steering and a function of the trans-impedance amplifier have been described above in detail with reference to FIG. 5. For brevity, details are not described herein again.

A 2-bit digital signal is used as an example, and correspondingly there are four binary numbers: "00", "01", "10", and "11". In this case, conversion from a digital signal to an analog signal can be implemented using a digital-to-analog converter in which N=3. It should be noted that the digital-to-analog conversion in the example herein is described merely using a hot code form as an example, but this should not constitute any limitation to this application. This application does not specially limit a transcoding manner in a digital-to-analog conversion process.

Further, three first switch groups on a first branch and three second switch groups on a second branch may be separately used for control. For example, for a digital signal "00", the three first switch groups on the first branch may be set to be in a closed state, and the three second switch groups on the second branch may be set to be in an open state; for a digital signal "01", two first switch groups on the first branch may be set to be in the closed state, and one second switch group on the second branch may be set to be in the closed state; for a digital signal "10", one first switch group on the first branch may be set to be in the closed state, and two second switches group on the second branch may be set to be in the closed state; and for a digital signal "11", the three first switch groups on the first branch may be set to be in the open state, and the three second switches on the second branch may be set to be in the closed state. Therefore, a total current on the first branch can be regulated in a range of [0, 8I], and a total current on the second branch can also be regulated in the range of [0, 8I].

The currents on the first branch and the second branch are regulated such that two output ends of a trans-impedance amplifier can output different voltages, and then different analog voltages are obtained. For example, for the digital signal "00", a voltage output by a first output end of the trans-impedance amplifier is $V_1=V_0-8IR$, a voltage output by a second output end of the trans-impedance amplifier is $V_2=V_0$, and an obtained analog voltage is $V_1-V_2=-8IR$; and for the digital signal "01", a voltage output by the first output end of the trans-impedance amplifier is $V_1=V_0-6IR$, a voltage output by the second output end of the trans-impedance amplifier is $V_2=V_0-2IR$, and an obtained analog voltage is $V_1-V_2=-4IR$. By analogy, for the digital signal "10", an analog signal is 4IR, and for the digital signal "11", an analog voltage is 0.

In other words, currents on the first branch and the second branch can be both regulated in the range of [0, 8I] by controlling the N first switch groups and the N second switch groups.

Similarly, in a digital-to-analog converter used for a digital signal of more bits, currents on a first branch and a second branch can be respectively regulated using first switch groups and second switch groups in different current steering structures. To avoid repetition, detailed descriptions thereof are omitted herein.

Therefore, in the digital-to-analog converter in this embodiment of this application, the second current source module is removed, in other words, this is similar to a case in which a quiescent current of the second current source module is controlled to be 0 such that the quiescent current fully flows through the trans-impedance amplifier, to reduce noise generated by the quiescent current in the digital-to-analog converter. Compared with a current steering structure of a single-side switch type in other approaches, the solution in this embodiment reduces the quiescent current by 2I such that noise generated by the quiescent current is greatly reduced when a same output signal amplitude is ensured and circuit complexity is not increased. In addition, compared with a current steering structure of a double-side switch type, the solution in this embodiment greatly reduces power consumption caused by the quiescent current.

Case 2:

A difference between the second-type digital-to-analog converter and the first-type digital-to-analog converter is that the second-type digital-to-analog converter supplies a reverse current $I_1$ using the first current source module, and a direction of a current flowing through the first switch control module in the second-type digital-to-analog converter is opposite to a direction of a current flowing through the first switch control module in the first-type digital-to-analog converter. Further, in the first-type digital-to-analog converter, a current flows from the first current source module to the trans-impedance amplifier through the first switch control module, and in the second-type digital-to-analog converter, a current flows from the trans-impedance amplifier to the first current source module through the first switch control module.

Optionally, in the second-type digital-to-analog converter, the first current source module includes R first current sinks respectively configured in R current steering structures, and the first switch control module includes R third switch groups respectively configured in the R current steering structures and R fourth switch groups respectively configured in the R current steering structures. A first end of an $x^{th}$ third switch group in the R third switch groups and a first end of an $x^{th}$ fourth switch group in the R fourth switch groups are both connected to an $x^{th}$ first current sink in the R first current sinks, a second end of each of the R third switch groups is connected to a first input end of the trans-impedance amplifier, a second end of each of the R fourth switch groups is connected to a second input end of the trans-impedance amplifier, the current $I_1$ supplied by the first current source module is a sum of currents supplied by the R first current sinks, $x \in [1, R]$, and both x and R are natural numbers greater than or equal to 1.

Figure 7:
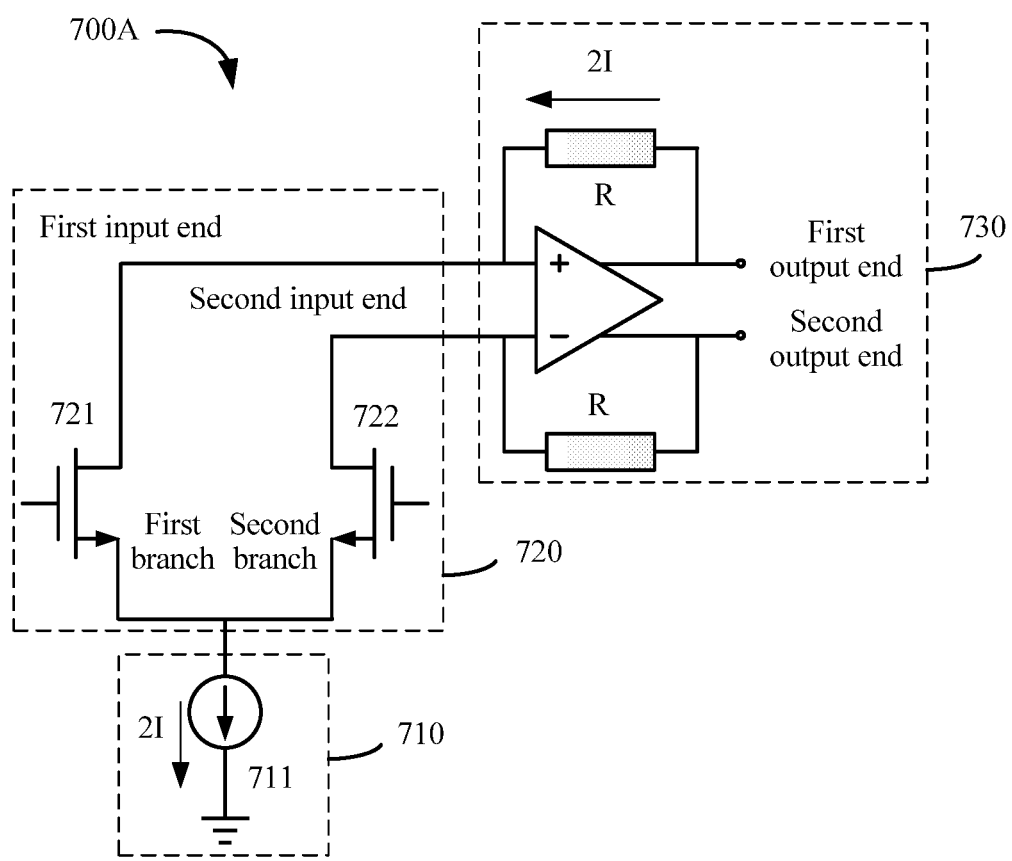
FIG. 7 is still another schematic structural diagram of a digital-to-analog converter according to an embodiment of this application.

FIG. 7 is still another schematic structural diagram of a digital-to-analog converter 700A according to an embodiment of this application. Further, FIG. 7 shows another example of a digital-to-analog converter used for a single-bit digital signal, in an embodiment, R=1. As shown in FIG. 7, the digital-to-analog converter 700A includes a first current source module 710, a first switch control module 720, and a trans-impedance amplifier 730. The first current source module 710 includes a first current sink 711, and the first switch control module 720 includes a third switch group 721 and a fourth switch group 722. The first current source module 710 and the first switch control module 720 form a current steering structure. The current steering structure may include two branches (for example, a first branch and a second branch). The first current sink 711 is connected to both the third switch group 721 configured on the first branch and the fourth switch group 722 configured on the second branch. The third switch group 721 is connected to a first input end of the trans-impedance amplifier 730, and the fourth switch group 722 is connected to a second input end of the trans-impedance amplifier 730. In an embodiment, the first switch control module 720 controls connection or disconnection between the first branch and the trans-impedance amplifier 730 using the third switch group 721, and the first switch control module 720 controls connection or disconnection between the second branch and the trans-impedance amplifier 730 using the fourth switch group 722.

Each switch group of the first switch control module includes at least one switching transistor. Optionally, by way of example rather than limitation, the switching transistor is a MOS transistor.

Further, in this embodiment of this application, the MOS transistor may be an N-type MOS transistor. In the third switch group, a source of each MOS transistor is connected to a first end of the third switch group, and a drain of each MOS transistor is connected to a second end of the third switch group. In the fourth switch group, a source of each MOS transistor is connected to a first end of the fourth switch group, and a drain of each MOS transistor is connected to a second end of the fourth switch group. The first end of the third switch group is connected to the first current sink, and the second end of the third switch group is connected to the first input end of the trans-impedance amplifier. The first end of the fourth switch group is connected to the first current sink, and the second end of the fourth switch group is connected to the second input end of the trans-impedance amplifier.

It is assumed that a reverse current $I_1$ supplied by the first current sink is 2I, the third switch group is in a closed state, and the fourth switch group is in an open state. In this case, the 2I current flows to the trans-impedance amplifier through the first branch via the third switch group and the first input end of the trans-impedance amplifier. As described above, there is a virtual short circuit between the two input ends of the trans-impedance amplifier. It is assumed that both input voltages are $V_0$, and a resistance of the trans-impedance amplifier is R. In this case, a voltage of a first output end that is of the trans-impedance amplifier and that corresponds to the first branch is $V_1=V_0+2IR$, and a voltage of a second output end that is of the trans-impedance amplifier and that corresponds to the second branch is $V_2=V_0$. Therefore, a common-mode voltage of the output ends of the trans-impedance amplifier is $V_{com}=V_0+IR$. In this case, the voltage of the first output end that is of the trans-impedance amplifier and that corresponds to the first branch is $V_1=V_{com}+IR$, and the voltage of the second output end that is of the trans-impedance amplifier and that corresponds to the second branch is $V_2=V_{com}-IR$, in an embodiment, a differential-mode voltage is $V_1-V_{com}=-(V_2-V_{com})$.

Similarly, if the fourth switch group is closed, and the third switch group is open, the second branch is closed, the first branch is open, and voltages output by the first output end and the second output end of the trans-impedance amplifier are respectively $V_1=V_{com}-IR$ and $V_2=V_{com}+IR$, in an embodiment, $V_1-V_{com}=-(V_2-V_{com})$.

Therefore, it can be learned that a common-mode voltage of the input ends of the trans-impedance amplifier is different from the common-mode voltage of the output ends of the trans-impedance amplifier. Although a quiescent current is not removed using the current sink, an expected analog voltage can still be obtained using the trans-impedance amplifier matching the different common-mode voltages of the input ends and the output ends, to indicate a different digital signal.

Figure 8:
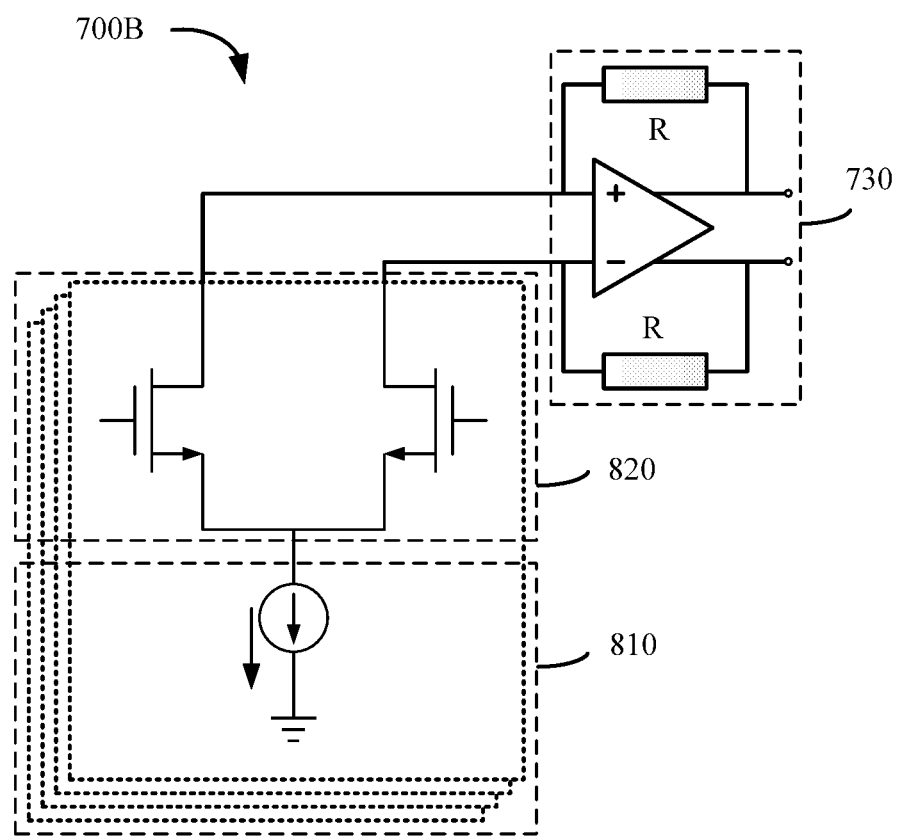
FIG. 8 is yet another schematic structural diagram of a digital-to-analog converter according to an embodiment of this application.

FIG. 8 is yet another schematic structural diagram of a digital-to-analog converter 700B according to an embodiment of this application. Further, FIG. 8 shows another example of a digital-to-analog converter used for a multi-bit digital signal, in an embodiment, R>1. As shown in FIG. 8, the digital-to-analog converter 700B includes a first current source module 810, a first switch control module 820, and a trans-impedance amplifier 730. The first current source module 810 includes R third current sinks 711 shown in FIG. 7 that are respectively configured in R current steering structures, and the first switch control module includes R third switch groups 721 shown in FIG. 7 that are respectively configured in the R current steering structures and R fourth switch groups 722 that are respectively configured in the R current steering structures. In other words, each current steering includes a third current sink, a third switch group, and a fourth switch group. The R current steering structures form a current steering structure, and each current steering may be understood as one unit of the current steering structure. The current steering structure may include two branches (for example, a first branch and a second branch).

Further, in an $x^{th}$ current steering in the R current steering structures, a first end of a third switch group and a first end of a fourth switch group are both connected to a third current sink. Second ends of the R third switch groups are all connected to a first input end of the trans-impedance amplifier, and second ends of the R fourth switch groups are all connected to a second input end of the trans-impedance amplifier. In an embodiment, the third switch group in each current steering is configured on the first branch, the fourth switch group in each current steering is configured on the second branch, the first input end of the trans-impedance amplifier is connected to the first branch, and the second input end of the trans-impedance amplifier is connected to the second branch.

Because the R first current source modules in the R current steering structures jointly supply currents, a current $I_1$ supplied by the first current source module 810 is a sum of the currents supplied by the R third current sinks. It is assumed that each third current sink supplies a 2I current. In this case, a value of a current output by the first current source module can be regulated in a range of [0, 2RI] by controlling closure or openness of the R third switch groups and the R fourth switch groups.

A 2-bit digital signal is still used as an example. In this case, conversion from a digital signal to an analog signal can be implemented using a digital-to-analog converter in which R=3. Further, three third switch groups on a first branch and three fourth switch groups on a second branch may be separately used for control such that a total current on the first branch can be regulated in a range of [0, 8I], and a total current on the second branch can also be regulated in the range of [0, 8I].

It should be noted that the digital-to-analog conversion in the example herein is described merely using a hot code form as an example, but this should not constitute any limitation to this application. This application does not specially limit a transcoding manner in a digital-to-analog conversion process.

Similarly, in a digital-to-analog converter used for a digital signal of more bits, currents on a first branch and a second branch can be respectively regulated using third switch groups and fourth switch groups in the different branches. To avoid repetition, detailed descriptions thereof are omitted herein.

It should be understood that a function of the first current sink in each current steering is similar to the function of the first current sink described above with reference to FIG. 7, and functions of the third switch group and the fourth switch group in each current steering and a function of the trans-impedance amplifier have been described in detail above with reference to FIG. 7. For brevity, details are not described herein again.

Therefore, in the digital-to-analog converter in this embodiment of this application, the second current source module is removed, in other words, this is similar to a case in which a quiescent current flowing through the second current source module is controlled to be 0 such that the quiescent current fully flows through the trans-impedance amplifier, to reduce noise generated by the quiescent current in the digital-to-analog converter. Compared with a current steering structure of a single-side switch type in other approaches, the solution in this embodiment reduces the quiescent current by 2I such that noise generated by the quiescent current is greatly reduced when a same output signal amplitude is ensured and circuit complexity is not increased. In addition, compared with a current steering structure of a double-side switch type, the solution in this embodiment greatly reduces power consumption caused by the quiescent current.

The foregoing describes, in detail with reference to FIG. 4 to FIG. 8, the cases in which the second current source module is removed, and the following describes, in detail with reference to FIG. 9 to FIG. 15, cases (including case 3 and case 4) in which the second current source module is not removed.

In case 3 and case 4, the second current source module may be adjusted such that a quiescent current $I_2$ flowing through the second current source module is reduced, and even can be reduced to 0, in an embodiment, $0 \leq I_2 < I_1$.

Figure 9:
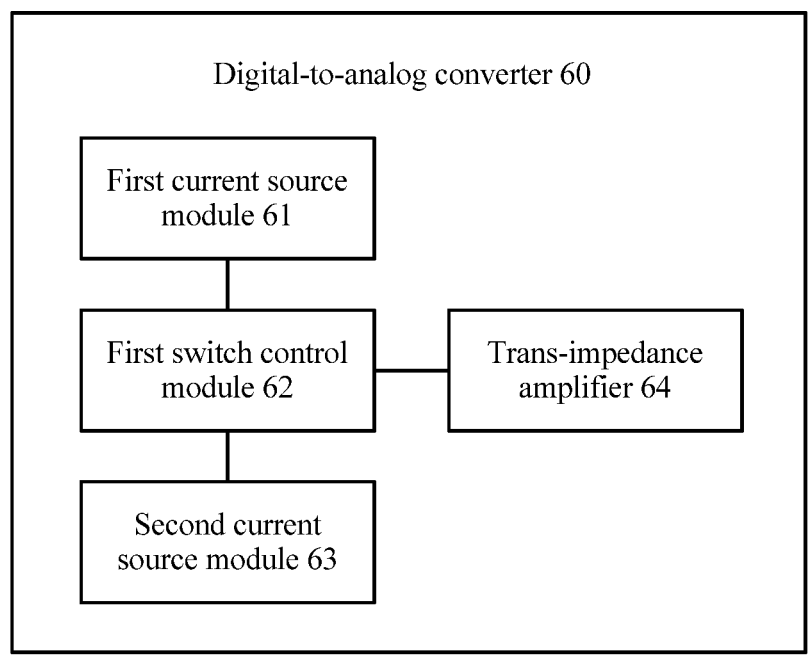
FIG. 9 is a schematic block diagram of a digital-to-analog converter according to another embodiment of this application.

FIG. 9 is a schematic block diagram of a digital-to-analog converter 60 according to another embodiment of this application. As shown in FIG. 9, the digital-to-analog converter 60 includes a first current source module 61, a first switch control module 62, a second current source module 63, and a trans-impedance amplifier 64. The first current source module 61, the first switch control module 62, and the second current source module 63 form a current steering structure. The first current source module 61 is configured to supply a current $I_1$ to the current steering structure. The first switch control module 62 is configured to control connection or disconnection between each branch of the current steering structure and the trans-impedance amplifier 64 based on a to-be-converted digital signal, or control connection or disconnection of each branch connected between the first current source module 61 and the trans-impedance amplifier 64 based on a to-be-converted digital signal. The second current source module 63 is configured to regulate a quiescent current $I_2$ flowing through the second current source module 63, to control a common-mode current flowing through the trans-impedance amplifier 64. The trans-impedance amplifier 64 is configured to: convert the current (it may be understood that the current flowing through the trans-impedance amplifier 64 is not necessarily the same as the current $I_1$ supplied by the first current source module) flowing through the trans-impedance amplifier 64 into an analog voltage, and output the analog voltage. Therefore, the digital-to-analog converter completes conversion from the digital signal to an analog signal.

It should be noted that the first current source module 61 may correspond to the current source 31 in the digital-to-analog converter 30 in FIG. 3, the first switch control module 62 may correspond to the switching transistor #A 32 and the switching transistor #B 33 in the digital-to-analog converter 30 in FIG. 3, the second current source module 63 may correspond to the current sink #A 34 and the current sink #B 35 in the digital-to-analog converter 30 in FIG. 3, and the trans-impedance amplifier 64 may correspond to the trans-impedance amplifier 36 in the digital-to-analog converter 30 in FIG. 3. It should be understood that herein, merely for ease of understanding, the digital-to-analog converter 60 in this embodiment of this application is described with reference to the modules in the digital-to-analog converter shown in FIG. 3, but this should not constitute any limitation to this application. For example, the first switch control module may include more switching transistors connected in parallel.

It should be particularly noted that different from the current steering structure of the single-side switch type shown in FIG. 3, the quiescent current $I_2$ flowing through the second current source module and the current $I_1$ supplied by the first current source module meet $0 \leq I_2 < I_1$. In other words, the quiescent current partially or fully flows to the trans-impedance amplifier such that a common-mode voltage of input ends of the trans-impedance amplifier is different from a common-mode voltage of output ends of the trans-impedance amplifier. Therefore, the trans-impedance amplifier in this embodiment of this application is also different from the trans-impedance amplifier shown in FIG. 3.

The following describes in detail case 3 and case 4.

Case 3:

Optionally, similar to case 1, in the first-type digital-to-analog converter, the first current source module includes N first current sources respectively configured in N current steering structures, and the first switch control module includes N first switch groups respectively configured in the N current steering structures and N second switch groups respectively configured in the N current steering structures. A first end of an $i^{th}$ first switch group in the N first switch groups and a first end of an $i^{th}$ second switch group in the N second switch groups are both connected to an $i^{th}$ first current source in the N current sources, a second end of each of the N first switch groups is connected to a first input end of the trans-impedance amplifier, a second end of each of the N second switch groups is connected to a second input end of the trans-impedance amplifier, the current $I_1$ supplied by the first current source module is a sum of currents supplied by the N first current sources, $i \in [1, N]$, and both i and N are natural numbers greater than or equal to 1.

Optionally, the second current source module includes M first controllable current sinks connected to the first input end of the trans-impedance amplifier and M second controllable current sinks connected to the second input end of the trans-impedance amplifier. The quiescent current $I_2$ flowing through the second current source module is a sum of currents flowing through the M first controllable current sinks and currents flowing through the M second controllable current sinks, and M is a natural number greater than or equal to 1.

FIG. 10 is a schematic structural diagram of a digital-to-analog converter 500C according to another embodiment of this application. Further, FIG. 10 shows still another example of a digital-to-analog converter used for a single-bit digital signal, in an embodiment, N=1. As shown in FIG. 10, the digital-to-analog converter 500C includes a first current source module 510, a first switch control module 520, a trans-impedance amplifier 530, and a second current source module 540. The first current source module 510, the first switch control module 520, and the trans-impedance amplifier 530 may be the same as the first current source module 510, the first switch control module 520, and the trans-impedance amplifier 530 in the digital-to-analog converter 500A shown in FIG. 5. The second current source module 540 may include a first controllable current sink 541 and a second controllable current sink 542. The first current source module 510, the first switch control module 520, and the second current source module 540 form a current steering structure. The current steering structure includes two branches, denoted as, for example, a first branch and a second branch. The first branch and the second branch may be two branches the same as the first branch and the second branch that are shown in FIG. 5. In addition, a connection relationship between the first current source module 510, the first switch control module 520, and the trans-impedance amplifier 530 is the same as the connection relationship shown in FIG. 5. The first controllable current sink submodule 541 included in the second current source module 540 is configured on the first branch, and the second controllable current sink submodule 542 included in the second current source module 540 is configured on the second branch. The first controllable current sink submodule 541 may be connected to a first input end of the trans-impedance amplifier 530, and the second controllable current sink submodule 542 may be connected to a second input end of the trans-impedance amplifier 530. The first controllable current sink submodule 541 and the second controllable current sink submodule 542 may respectively control connection or disconnection between the second current source module and the first branch and connection or disconnection between the second current source module and the second branch, and when the second current source module is connected to the first branch and the second branch, control a value of a quiescent current flowing through the second current source module.

Optionally, the second current source module 540 includes M first controllable current sinks connected to the first input end of the trans-impedance amplifier 530 and M second controllable current sinks connected to the second input end of the trans-impedance amplifier 530, and M is a natural number greater than or equal to 1.

FIG. 11 is a schematic structural diagram of the second current source module 540 in the digital-to-analog converter 500C according to the other embodiment of this application. As shown in FIG. 11, the M first controllable current sinks are connected in parallel between the first input end of the trans-impedance amplifier and the ground, and the M second controllable current sinks are connected in parallel between the second input end of the trans-impedance amplifier and the ground. The M first controllable current sinks form the first controllable current sink submodule 541, and the M second controllable current sinks form the second controllable current sink submodule 542.

Circuit connections of the first controllable current sink submodule and the second controllable current sink submodule in the second current source module may be shown in FIG. 11. In an embodiment, each of the M first controllable current sinks includes a fifth switch group 543 and a second current sink 544, and each of the M second controllable current sinks includes a sixth switch group 545 and a third current sink 546. In a $j^{th}$ ($j \in [1, M]$, and j is a natural number) first controllable current sink, the fifth switch group is configured to control connection or disconnection between the second current sink and each of the first current source module and the trans-impedance amplifier. In a $j^{th}$ second controllable current sink, the sixth switch group is configured to control connection or disconnection between the third current sink and each of the first current source module and the trans-impedance amplifier.

It may be understood that fifth switch groups of the first controllable current sink submodule and sixth switch groups of the second controllable current sink submodule may be closed or open simultaneously, to simultaneously control connection or disconnection between current sinks (including second current sinks and third current sinks) and each of the first switch control module and the trans-impedance amplifier. Therefore, a quiescent current flowing through the first controllable current sink submodule is the same as a quiescent current flowing through the second controllable current sink submodule, and a same quiescent current or different quiescent currents may flow through any two current sinks in a same controllable current sink submodule.

In a circuit of the second current source module shown in FIG. 11, each switch group includes at least one switching transistor. By way of example rather than limitation, the switching transistor is a MOS transistor.

Further, in this embodiment of this application, the MOS transistor may be an N-type MOS transistor. As shown in FIG. 11, in the first controllable current sink submodule, a source of each MOS transistor is connected to the first input end of the trans-impedance amplifier, and a drain of each MOS transistor is connected to the second current sink; and in the second controllable current sink submodule, a source of each MOS transistor is connected to the second input end of the trans-impedance amplifier, and a drain of each MOS transistor is connected to the third current sink.

In this embodiment of this application, the quiescent current flowing through the second current source module can be controlled to be regulated in a range of [0, 2I] by closing or opening the M fifth switch groups and the M sixth switch groups.

It is assumed that a current $I_1$ supplied by the first current source is 2I, a first switch group is in a closed state, and a second switch group is in an open state.

If the fifth switch groups of the M first controllable current sinks and the sixth switch groups of the M second controllable current sinks are all in the open state, the quiescent current $I_2$ flowing through the second current source module is equal to 0.

In this case, if both input voltages are $V_0$, and a resistance of the trans-impedance amplifier is R, a voltage of a first output end of the trans-impedance amplifier is $V_1 = V_0 - 2IR$, and a voltage of a second output end of the trans-impedance amplifier is $V_2 = V_0$. This is similar to the case, shown in FIG. 5, in which the second current source module is removed. A correspondence between an output analog voltage and a digital signal has been described in detail above with reference to FIG. 5. For brevity, details are not described herein again.

If a fifth switch group of at least one of the M first controllable current sinks is in the closed state and a sixth switch group of at least one of the M second controllable current sinks is in the closed state, the quiescent current $I_2$ flowing through the second current source module is a sum of a current flowing through the connected second current sink and a current flowing through the connected third current sink, and the quiescent current $I_2$ and the current $I_1$ that flows through the first current source module meet $0 < I_2 < I_1$.

As described above, because it is assumed that the first switch group is in the closed state, the fifth switch groups of the first controllable current sink submodule are configured to control connection or disconnection between the corresponding second current sinks and each of the first current source module and the trans-impedance amplifier; and because it is assumed that the second switch group is in the open state, the second controllable current sink submodule is disconnected from the first current source module, and the sixth switch groups of the second controllable current sink submodule are configured to control connection or disconnection between the corresponding third current sinks and the trans-impedance amplifier.

It may be understood that as a quantity of fifth switch groups in the closed state in the M first controllable current sinks and a quantity of sixth switch groups in the closed state in the M second controllable current sinks increase, the value of the quiescent current $I_2$ flowing through the second current source module also increases, but still meets $0<I_2<I_1$.

In this case, if both input voltages are $V_0$, a resistance of the trans-impedance amplifier is R, and any quiescent current flowing through the first controllable current sink submodule is $I-\Delta I$, a current flowing through a resistor (namely, $R_1$ in the figure) that is of the trans-impedance amplifier and that corresponds to the first branch is $I_3=I+\Delta I$. To keep a quiescent current flowing through the second controllable current sink submodule the same as the quiescent current flowing through the first controllable current sink submodule, the trans-impedance amplifier may be configured to supply a current to the second controllable current sink submodule. In this case, a current flowing through a resistor (namely, $R_2$ in the figure) that is of the trans-impedance amplifier and that corresponds to the second branch is $I_4=I-\Delta I$. Therefore, a voltage of a first output end of the trans-impedance amplifier is $V_1=V_0-(I+\Delta I)R$, and a voltage of a second output end of the trans-impedance amplifier is $V_2=V_0+(I-\Delta I)R$. In this case, it can be learned that a common-mode voltage of the output ends of the trans-impedance amplifier is $V_{com}=V_0-\Delta IR$, the voltage of the first output end that is of the trans-impedance amplifier and that corresponds to the first branch is $V_1=V_{com}-IR$, and the voltage of the second output end that is of the trans-impedance amplifier and that corresponds to the second branch is $V_2=V_{com}+IR$, in an embodiment, a differential-mode voltage is $V_1-V_{com}=-(V_2-V_{com})$.

Similarly, it is assumed that the second switch group is in the closed state, and the first switch group is in the open state. In this case, voltages of output ends of the trans-impedance amplifier are $V_1=V_0+(I-\Delta I)R$ and $V_2=V_0-(I+\Delta I)R$, in an embodiment, $V_1-V_{com}=-(V_2-V_{com})$. It should be understood that a case in which the second switch group is closed and the first switch group is open is similar to the case in which the first switch group is closed and the second switch group is open. For brevity, detailed descriptions thereof are omitted herein.

Therefore, it can be learned that a common-mode voltage of the input ends of the trans-impedance amplifier is different from the common-mode voltage of the output ends of the trans-impedance amplifier. Although the quiescent current is not removed using the current sinks, an expected analog voltage can still be obtained using the trans-impedance amplifier matching the different common-mode voltages of the input ends and the output ends, to indicate a different digital signal.

It should be noted that in the digital-to-analog converter shown in FIG. 10, on the two branches connected to the trans-impedance amplifier, directions of currents flowing through the two resistors are opposite. A current flowing through the resistor (for example, $R_1$) on the first branch flows from the first input end to the first output end, and the current is a part of the current $I_1$ supplied by the first current source. A current flowing through the resistor (for example, $R_2$) on the second branch flows from the second output end to the second input end, and the current is supplied by the first output end of the trans-impedance amplifier. It may be understood that for an operation amplifier, directions of positive and negative input ends are opposite to directions of positive and negative output ends. In an embodiment, the second input end of the trans-impedance amplifier is a negative input end, and the first output end of the trans-impedance amplifier is a negative output end. In other words, the current flowing through the resistor on the second branch is supplied by the negative output end of the trans-impedance amplifier. For brevity, descriptions of a same or similar case are omitted below.

FIG. 12 is another schematic structural diagram of a digital-to-analog converter 500D according to another embodiment of this application. Further, FIG. 12 shows an example of a digital-to-analog converter used for a multi-bit digital signal, in an embodiment, N>1. As shown in FIG. 12, the digital-to-analog converter 500D includes a first current source module 610, a first switch control module 620, a trans-impedance amplifier 530, and a second current source module 540. In an embodiment, structures of and a connection relationship between the first current source module 610 and the first switch control module 620 are similar to the structures of and the connection relationship between the first current source module 610 and the first switch control module 620 that are shown in FIG. 6, and details are not described herein again. A structure and a connection relationship of the second current source module 540 are similar to the structure and the connection relationship of the second current source module 540 shown in FIG. 10 and FIG. 11, and details are not described herein again. A structure and a connection relationship of the trans-impedance amplifier 530 are similar to the structure and the connection relationship of the trans-impedance amplifier shown in FIG. 5, FIG. 6, and FIG. 10, and details are not described herein again.

In the digital-to-analog converter 500D, functions of switch groups on a first branch and a second branch are similar to the functions of the switch groups on the first branch and the second branch in the digital-to-analog converter 500B shown in FIG. 6. When quiescent currents flowing through two controllable current sink submodules in the second current source module 540 are both $I-\Delta I$, output voltages of the trans-impedance amplifier are $V_1=V_0-(I+\Delta I)R$ and $V_2=V_0+(I-\Delta I)R$, or $V_1=V_0+(I-\Delta I)R$ and $V_2=V_0-(I+\Delta I)R$, in an embodiment, $V_1-V_{com}=-(V_2-V_{com})$.

It may be understood that in the digital-to-analog converter shown in case 3, if the M fifth switch groups and the M sixth switch groups in the second current source module are all in the open state, in other words, the second current source module is disconnected from both the first current source module and the trans-impedance amplifier, this case may be equivalent to a case in which the second current source module is removed, in other words, the digital-to-analog converter shown in case 3 is similar to the digital-to-analog converter shown in case 1.

Therefore, in the digital-to-analog converter in this embodiment of this application, the second current source module is adjusted such that the quiescent current flowing through the second current source module is reduced and even is 0, to reduce noise generated by the quiescent current in the digital-to-analog converter. Compared with a current steering structure of a single-side switch type in other approaches, the solution in this embodiment reduces the quiescent current $2\Delta I$ such that noise generated by the quiescent current is greatly reduced when a same output signal amplitude is ensured and circuit complexity is not increased. In addition, compared with a current steering structure of a double-side switch type, the solution in this embodiment greatly reduces power consumption caused by the quiescent current.

Case 4:

Optionally, similar to case 2, in the second-type digital-to-analog converter, the first current source module includes R first current sinks respectively configured in R current steering structures, and the first switch control module includes R third switch groups respectively configured in the R current steering structures and R fourth switch groups respectively configured in the R current steering structures. A first end of an $x^{th}$ third switch group in the R third switch groups and a first end of an $x^{th}$ fourth switch group in the R fourth switch groups are both connected to an $x^{th}$ first current sink in the R first current sinks, a second end of each of the R third switch groups is connected to a first input end of the trans-impedance amplifier, a second end of each of the R fourth switch groups is connected to a second input end of the trans-impedance amplifier, the current $I_1$ supplied by the first current source module is a sum of currents supplied by the R first current sinks, $x \in [1, R]$, and both x and R are natural numbers greater than or equal to 1.

Optionally, the second current source module includes S first controllable current sources connected to the first input end of the trans-impedance amplifier and S second controllable current sources connected to the second input end of the trans-impedance amplifier.

The quiescent current $I_2$ flowing through the second current source module is a sum of currents flowing through the S first controllable current sources and currents flowing through the S second controllable current sources, and S is a natural number greater than or equal to 1.

Figure 13:
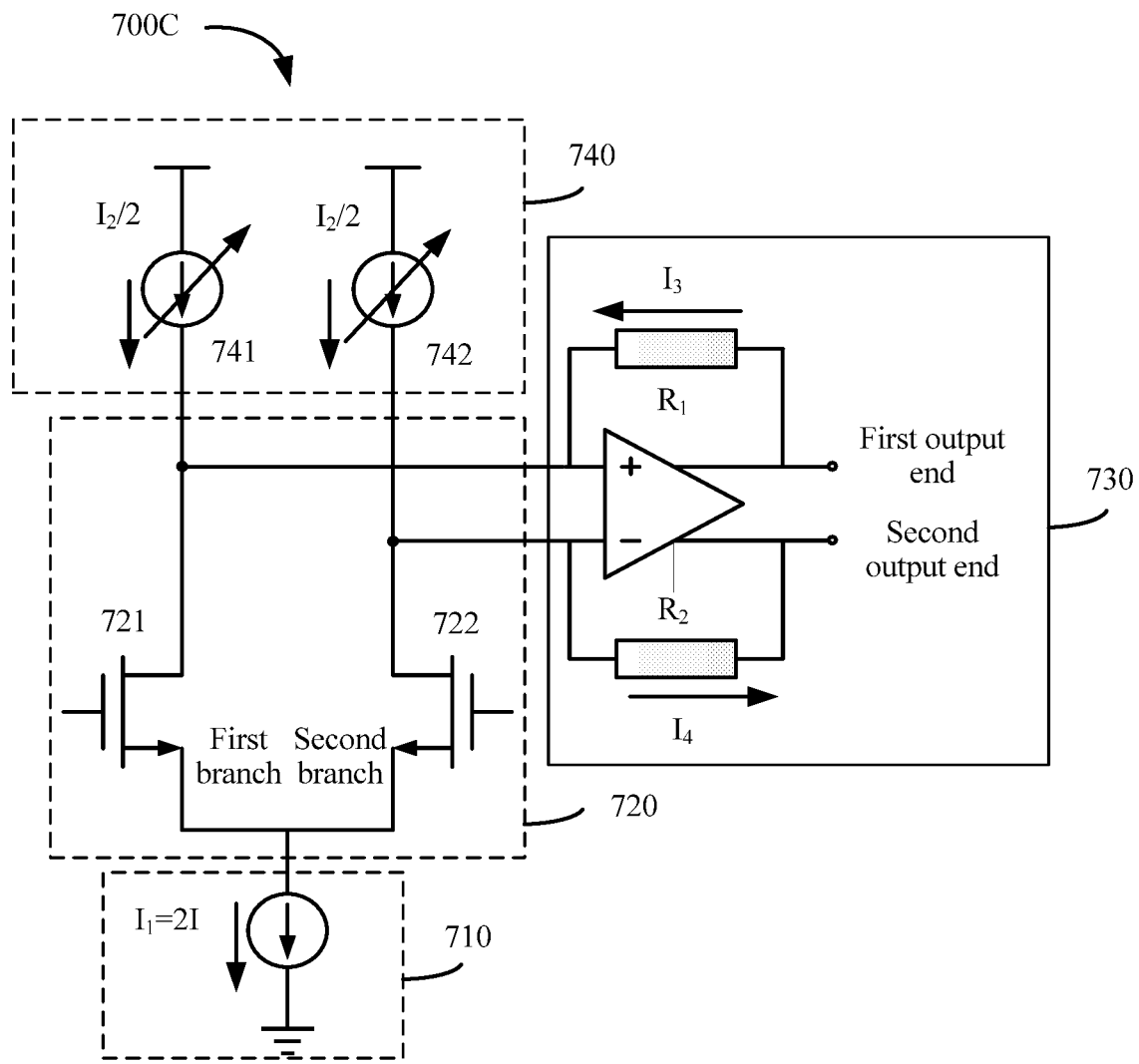
FIG. 13 is still another schematic structural diagram of a digital-to-analog converter according to another embodiment of this application.

FIG. 13 is still another schematic structural diagram of a digital-to-analog converter 700C according to another embodiment of this application. Further, FIG. 13 shows an example of a digital-to-analog converter used for a single-bit digital signal, in an embodiment, R=1. As shown in FIG. 13, the digital-to-analog converter 700C includes a first current source module 710, a first switch control module 720, a trans-impedance amplifier 730, and a second current source module 740. The first current source module 710, the first switch control module 720, and the trans-impedance amplifier 730 may be the same as the first current source module 710, the first switch control module 720, and the trans-impedance amplifier 730 in the digital-to-analog converter 700A shown in FIG. 7. The second current source module may include a first controllable current source submodule 741 and a second controllable current source submodule 742. The first current source module 710, the first switch control module 720, and the second current source module 740 form a current steering structure. The current steering structure includes two branches, for example, may include two branches the same as the first branch and the second branch that are shown in FIG. 8. In addition, a connection relationship between the first current source module 710, the first switch control module 720, and the trans-impedance amplifier 730 is the same as the connection relationship shown in FIG. 7. The first controllable current source submodule 741 included in the second current source module 740 is configured on the first branch, and the second controllable current source submodule 742 included in the second current source module 740 is configured on the second branch. The first controllable current source submodule 741 may be connected to a first input end of the trans-impedance amplifier 730, and the second controllable current source submodule 742 may be connected to a second input end of the trans-impedance amplifier 730. The first controllable current source submodule 741 and the second controllable current source submodule 742 may respectively control connection or disconnection between the second current source module and the first branch and connection or disconnection between the second current source module and the second branch, and when the second current source module is connected to the first branch and the second branch, control a value of a quiescent current flowing through the second current source module.

Optionally, the second current source module 740 includes S first controllable current sources connected to the first input end of the trans-impedance amplifier 730 and S second controllable current sources connected to the second input end of the trans-impedance amplifier 730, and S is a natural number greater than or equal to 1.

Figure 14:
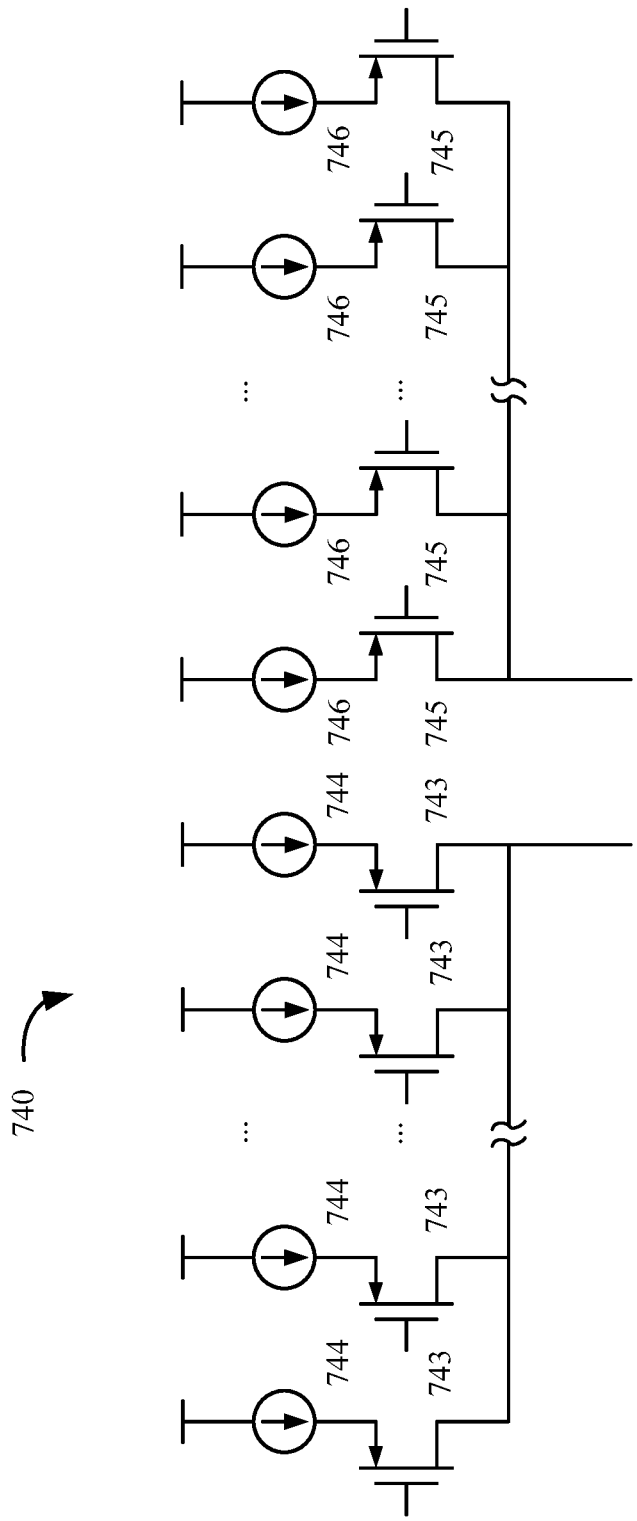
FIG. 14 is another schematic structural diagram of a second current source module in a digital-to-analog converter according to another embodiment of this application.

FIG. 14 is a schematic structural diagram of the second current source module 740 in the digital-to-analog converter 700C according to the other embodiment of this application. As shown in FIG. 14, the S first controllable current sources form the first controllable current source submodule 741, and the S second controllable current sources form the second controllable current source submodule 742.

Circuit connections of the first controllable current source submodule and the second controllable current source submodule in the second current source may be shown in FIG. 14. In an embodiment, each of the S first controllable current sources includes a seventh switch group 743 and a second current source 744, and each of the S second controllable current sources includes an eighth switch group 745 and a third current source 746. In a $y^{th}$ ($y \in [1, S]$, and y is a natural number) first controllable current source, the seventh switch group is configured to control connection or disconnection between the second current source and each of the first current source module and the trans-impedance amplifier. In a $y^{th}$ second controllable current source, the eighth switch group is configured to control connection or disconnection between the third current source and each of the first current source module and the trans-impedance amplifier.

It may be understood that seventh switch groups of the first controllable current source submodule and eighth switch groups of the second controllable current source submodule may be closed or open simultaneously, to simultaneously control connection or disconnection between current sources (including second current sources and third current sources) and each of the first switch control module and the trans-impedance amplifier. Therefore, a quiescent current flowing through the first controllable current source submodule is the same as a quiescent current flowing through the second controllable current source submodule, and a same quiescent current or different quiescent currents may flow through any two current sources in a same controllable current source submodule.

In a circuit of the second current source module shown in FIG. 14, each switch group includes at least one switching transistor. By way of example rather than limitation, the switching transistor is a MOS transistor.

Further, in this embodiment of this application, the MOS transistor may be a P-type MOS transistor. A connection relationship between the P-type MOS transistor and each of the current source and the first switch control module is similar to the connection relationship that is between the P-type MOS transistor and each of the current source and the trans-impedance amplifier and that is described above with reference to the accompanying drawing (for example, FIG. 5). For brevity, details are not described herein again.

In this embodiment of this application, the quiescent current flowing through the second current source module can be controlled to be regulated in a range of [0, 2I) by closing or opening the S seventh switch groups and the S eighth switch groups.

It is assumed that a reverse current $I_1$ supplied by the first current source module is 2I, a third switch group is in a closed state, and a fourth switch group is in an open state.

If the seventh switch groups of the S first controllable current sources and the eighth switch groups of the S second controllable current sources are all in the open state, the quiescent current $I_2$ flowing through the second current source module is equal to 0.

In this case, if both input voltages are $V_0$, and a resistance of the trans-impedance amplifier is R, a voltage of a first output end of the trans-impedance amplifier is $V_1=V_0+2I\,R$, and a voltage of a second output end of the trans-impedance amplifier is $V_2=V_0$. This is similar to the case, shown in FIG. 7, in which the second current source module is removed. A correspondence between an output analog voltage and a digital signal has been described in detail above with reference to FIG. 7. For brevity, details are not described herein again.

If a seventh switch group of at least one of the S first controllable current sources is in the closed state and an eighth switch group of at least one of the S second controllable current sources is in the closed state, the quiescent current $I_2$ flowing through the second current source module is a sum of a current flowing through the connected first controllable current source and a current flowing through the connected second controllable current source, and the quiescent current and the current $I_1$ that flows through the first current source module meet $0<I_2<I_1$.

As described above, because it is assumed that the third switch group is in the closed state, the seventh switch groups of the first controllable current source submodule are configured to control connection or disconnection between the corresponding second current sources and each of the first current source module and the trans-impedance amplifier; and because it is assumed that the fourth switch group is in the open state, the second controllable current source submodule is disconnected from the first current source module, and the eighth switch groups of the second controllable current source submodule are configured to control connection or disconnection between the corresponding third current sources and the trans-impedance amplifier.

It may be understood that as a quantity of seventh switch groups in the closed state in the S first controllable current source modules and a quantity of eighth switch groups in the closed state in the S second controllable current source modules increase, the value of the quiescent current $I_2$ flowing through the second current source module also increases, but still meets $0<I_2<I_1$.

In this case, if both input voltages are $V_0$, a resistance of the trans-impedance amplifier is R, and any quiescent current flowing through the first controllable current source submodule is I−ΔI, a current flowing through a resistor (namely, $R_1$ in the figure) that is of the trans-impedance amplifier and that corresponds to the first branch is $I_3$=I+ΔI. To keep a quiescent current flowing through the second controllable current source submodule the same as the quiescent current flowing through the first controllable current source submodule, the trans-impedance amplifier may be configured to supply a current to the second controllable current source submodule on the second branch. In this case, a current flowing through a resistor (namely, $R_2$ in the figure) that is of the trans-impedance amplifier and that corresponds to the second branch is $I_4$=I−ΔI. Therefore, a voltage of a first output end of the trans-impedance amplifier is $V_1=V_0+$(I+ΔI)R, and a voltage of a second output end of the trans-impedance amplifier is $V_2=V_0-$(I−ΔI)R. In this case, it can be learned that a common-mode voltage of the output ends of the trans-impedance amplifier is $V_{com}=V_0+\Delta IR$, the voltage of the first output end that is of the trans-impedance amplifier and that corresponds to the first branch is $V_1=V_{com}+IR$, and the voltage of the second output end that is of the trans-impedance amplifier and that corresponds to the second branch is $V_2=V_{com}-IR$, in an embodiment, a differential-mode voltage is $V_1-V_{com}=-(V_2-V_{com})$.

Similarly, it is assumed that the fourth switch group is in the closed state, and the third switch group is in the open state. In this case, voltages of output ends of the trans-impedance amplifier are $V_1=V_{com}-IR$ and $V_2=V_{com}+IR$, in an embodiment, $V_1-V_{com}=-(V_2-V_{com})$. It should be understood that a case in which the fourth switch group is closed and the third switch group is open is similar to the case in which the third switch group is closed and the fourth switch group is open. For brevity, detailed descriptions thereof are omitted herein.

Therefore, it can be learned that a common-mode voltage of the input ends of the trans-impedance amplifier is different from the common-mode voltage of the output ends of the trans-impedance amplifier. Although the quiescent current is not removed using the current sinks, an expected analog voltage can still be obtained using the trans-impedance amplifier matching the different common-mode voltages of the input ends and the output ends, to indicate a different digital signal.

Figure 15:
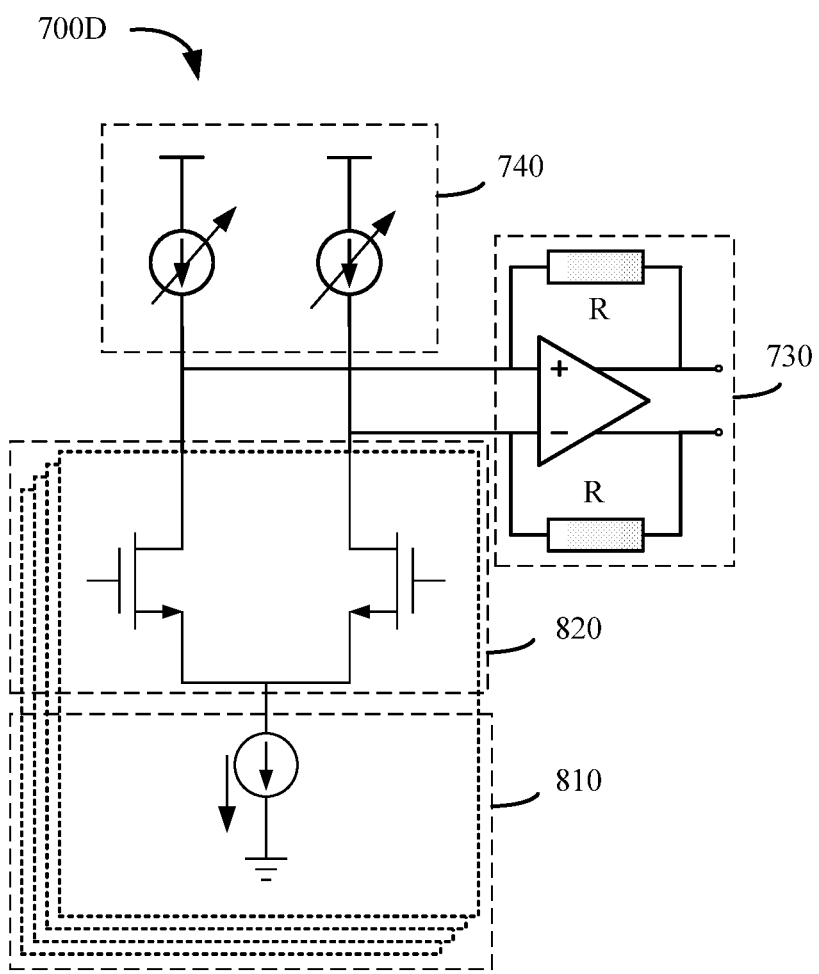
FIG. 15 is yet another schematic structural diagram of a digital-to-analog converter according to another embodiment of this application.

FIG. 15 is yet another schematic structural diagram of a digital-to-analog converter 700D according to another embodiment of this application. Further, FIG. 15 shows another example of a digital-to-analog converter used for a multi-bit digital signal, in an embodiment, R>1. As shown in FIG. 15, the digital-to-analog converter 700D includes a first current source module 810, a first switch control module 820, a trans-impedance amplifier 730, and a second current source module 740. In an embodiment, structures of and a connection relationship between the first current source module 810 and the first switch control module 820 are similar to the structures of and the connection relationship between the first current source module 810 and the first switch control module 820 shown in FIG. 8, and details are not described herein again. A structure and a connection relationship of the second current source module 740 are similar to the structure and the connection relationship of the second current source module 740 shown in FIG. 13 and FIG. 14, and details are not described herein again. A structure and a connection relationship of the trans-impedance amplifier 730 are similar to the structure and the connection relationship of the trans-impedance amplifier shown in FIG. 13, and details are not described herein again.

In the digital-to-analog converter 700D, functions of switch groups on a first branch and a second branch are similar to the functions of the switch groups on the first branch and the second branch in the digital-to-analog converter 700B shown in FIG. 8. When quiescent currents flowing through two controllable current source submodules in the second current source module 740 are both I−ΔI, output voltages of the trans-impedance amplifier are $V_1=V_0-$(I+ΔI)R and $V_2=V_0+$(I−ΔI)R, or $V_1=V_0+$(I−ΔI)R and $V_2=V_0-$(I+ΔI)R, in an embodiment, $V_1-V_{com}=-(V_2-V_{com})$.

It may be understood that in the digital-to-analog converter shown in case 4, if the S seventh switch groups and the S eighth switch groups in the second current source module are all in the open state, in other words, the second current source module is disconnected from both the first current source module and the trans-impedance amplifier, this case may be equivalent to a case in which the second current source module is removed, in other words, the digital-to-analog converter shown in case 4 is similar to the digital-to-analog converter shown in case 2.

Therefore, in the digital-to-analog converter in this embodiment of this application, the second current source module is adjusted such that the quiescent current flowing through the second current source module is reduced and even is 0, to reduce noise generated by the quiescent current in the digital-to-analog converter. Compared with a current steering structure of a single-side switch type in other approaches, the solution in this embodiment reduces the quiescent current $2\Delta I$ such that noise generated by the quiescent current is greatly reduced when a same output signal amplitude is ensured and circuit complexity is not increased. In addition, compared with a current steering structure of a double-side switch type, the solution in this embodiment greatly reduces power consumption caused by the quiescent current.

In conclusion, in the digital-to-analog converter in the embodiments of this application, the second current source module is adjusted such that the quiescent current flowing through the second current source module is reduced and even is 0, or the second current source module is removed, to reduce noise generated by the quiescent current in the digital-to-analog converter. Compared with a current steering structure of a single-side switch type in other approaches, the solution in the embodiments of this application reduces the quiescent current 2I such that noise generated by the quiescent current is greatly reduced when a same output signal amplitude is ensured and circuit complexity is not increased. In addition, compared with a current steering structure of a double-side switch type, the solution in the embodiments of this application greatly reduces power consumption caused by the quiescent current.

It should be understood that the elements and the connection relationships in the circuits in the foregoing examples are merely for illustration purposes, and should not constitute any limitation to this application. This application does not exclude a possibility that the elements in the embodiments of this application are replaced with elements in other approaches or a future technology to implement same or similar functions.

It should be further understood that the correspondence between a digital signal and an analog signal in the foregoing examples is merely for an illustration purpose, and should not constitute any limitation to this application.

A person of ordinary skill in the art may be aware that units and algorithm steps in the examples described with reference to the embodiments disclosed in this specification can be implemented by electronic hardware or a combination of computer software and electronic hardware. Whether the functions are performed by hardware or software depends on particular applications and design constraints of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division during actual implementation. For example, a plurality of units or components may be combined or integrated into another system, or some features may be ignored or not performed. In addition, the displayed or discussed mutual couplings or direct couplings or communication connections may be implemented using some interfaces. The indirect couplings or communication connections between the apparatuses or units may be implemented in electrical, mechanical, or other forms.

The units described as separate parts may or may not be physically separate, and parts displayed as units may or may not be physical units, in an embodiment, may be located in one position, or may be distributed on a plurality of network units. Some or all of the units may be selected based on actual requirements to achieve the objectives of the solutions of the embodiments.

In addition, the functional units in the embodiments of this application may be integrated into one processing unit, or each of the units may exist alone physically, or two or more units may be integrated into one unit.

When the functions are implemented in a form of a software functional unit and sold or used as an independent product, the functions may be stored in a computer-readable storage medium. Based on such an understanding, the technical solutions of this application essentially, or the part contributing to other approaches, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of this application. The storage medium includes: any medium that can store program code, for example, a universal serial bus (USB) flash drive, a removable hard disk, a read-only memory (ROM), a random access memory (RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A digital-to-analog converter, comprising:
   a first current source circuit configured to supply a current $I_1$, wherein the first current source circuit comprises N first current sources;
   a trans-impedance amplifier coupled to the first current source circuit and configured to:
      receive the current $I_1$ from the first current source circuit;
      convert the current $I_1$ into an analog voltage; and
      output the analog voltage; and
   a first switch controller coupled to the first current source circuit and the trans-impedance amplifier, wherein the first switch controller comprises:
      N first switch groups; and
      N second switch groups, wherein a first end of an $i^{th}$ first switch group in the N first switch groups and a first end of an $i^{th}$ second switch group in the N second switch groups are both coupled to an $i^{th}$ first current source in the N first current sources, wherein a second end of each of the N first switch groups is coupled to a first input end of the trans-impedance amplifier, wherein a second end of each of the N second switch groups is coupled to a second input end of the trans-impedance amplifier, wherein the current $I_1$ supplied by the first current source circuit is a sum of currents supplied by the N first current sources, wherein i is either one, N, or any natural number between 1 and N, and wherein N is a natural number.

2. The digital-to-analog converter of claim 1, wherein the trans-impedance amplifier comprises input ends and output ends, and wherein a common-mode voltage of the output ends different from the common-mode voltage of the input ends.

3. The digital-to-analog converter of claim 2, wherein each of the N first switch groups comprises at least one P-type metal-oxide semiconductor (MOS) transistor, wherein each of the N second switch groups comprises at least one P-type MOS transistor, wherein the first end of the $i^{th}$ first switch group and the first end of the $i^{th}$ second switch group respectively correspond to sources of the P-type MOS transistors, and wherein the second end of the $i^{th}$ first switch group and the second end of the $i^{th}$ second switch group respectively correspond to drains of the P-type MOS transistors.

4. A digital-to-analog converter, comprising:
a first current source circuit configured to supply a current $I_1$, wherein the first current source circuit comprises R first current sinks;
a trans-impedance amplifier coupled to the first current source circuit and configured to:
receive the current $I_1$ from the first current source circuit;
convert the current $I_1$ into an analog voltage; and
output the analog voltage; and
a first switch controller coupled to the first current source circuit and the trans-impedance amplifier, wherein the first switch controller comprises:
R third switch groups; and
R fourth switch groups, wherein a first end of an $x^{th}$ third switch group in the R third switch groups and a first end of an $x^{th}$ fourth switch group in the R fourth switch groups are both coupled to an $x^{th}$ first current sink in the R first current sinks, wherein a second end of each of the R third switch groups is coupled to a first input end of the trans-impedance amplifier, wherein a second end of each of the R fourth switch groups is coupled to a second input end of the trans-impedance amplifier, wherein the current $I_1$ supplied by the first current source circuit is a sum of currents supplied by the R first current sinks, wherein x is either one or R, wherein both x and R are natural numbers greater than or equal to one.

5. The digital-to-analog converter of claim 4, wherein each of the R third switch groups comprises at least one N-type MOS transistor, wherein each of the R fourth switch groups comprises the at least one N-type MOS transistor, wherein the first end of the $x^{th}$ third switch group and the first end of the $x^{th}$ fourth switch group respectively correspond to sources of the N-type MOS transistors, and wherein the second end of the $x^{th}$ third switch group and the second end of the $x^{th}$ fourth switch group respectively correspond to drains of the N-type MOS transistors.

6. A digital-to-analog converter, comprising:
a first current source circuit configured to supply a current $I_1$, wherein the first current source circuit comprises:
N first current sources; and
a second current source circuit coupled to the first current source circuit;
a trans-impedance amplifier, wherein the trans-impedance amplifier is coupled to the first current source circuit and the second current source circuit, and wherein the trans-impedance is configured to:
convert current flowing through the trans-impedance amplifier into analog voltage; and
output the analog voltage;
a first switch controller, wherein the first switch controller comprises:
N first switch groups; and
N second switch groups, wherein a first end of an $i^{th}$ first switch group in the N first switch groups and a first end of an $i^{th}$ second switch group in the N second switch groups are both coupled to an $i^{th}$ first current source in the N first current sources, wherein a second end of each of the N first switch groups is coupled to a first input end of the trans-impedance amplifier, wherein a second end of each of the N second switch groups is coupled to a second input end of the trans-impedance amplifier, wherein the current $I_1$ supplied by the first current source circuit is a sum of currents supplied by the N first current sources, wherein i is either one or N, and wherein both i and N are natural numbers greater than or equal to one.

7. The digital-to-analog converter of claim 6, wherein the second current source circuit further comprises:
M first current sinks coupled to the first input end of the trans-impedance amplifier; and
M second current sinks coupled to the second input end of the trans-impedance amplifier, wherein a quiescent current $I_2$ is a sum of first currents flowing through the M first current sinks and second currents flowing through the M second current sinks, and wherein M is a natural number greater than or equal to one.

8. The digital-to-analog converter of claim 7, wherein the M first current sinks are controllable current sinks, and wherein the M second current sinks are controllable current sinks.

9. The digital-to-analog converter of claim 8, wherein each of the M first current sinks comprise:
at least one fifth switch group; and
at least one second current sink, wherein each of the M second current sinks comprise:
at least one sixth switch group; and
at least one third current sink, wherein the quiescent current $I_2$ flowing through the second current source circuit is equal to zero when fifth switch groups of the M first current sinks and sixth switch groups of the M second current sinks are all in an open state, wherein the quiescent current $I_2$ flowing through the second current source circuit meets $0<k\ I_2<I_1$ when a fifth switch group of at least one of the M first current sinks is in a closed state and a sixth switch group of the M second current sinks is in the closed state, and wherein the first current source circuit supplies the quiescent current I2, wherein the fifth switch group in a $j^{th}$ first controllable current sink in the M first current sinks is configured to:
control coupling between the second current sink; and
control either the first current source circuit or the trans-impedance amplifier, wherein the sixth switch group in a $j^{th}$ second controllable current sink in the M second current sinks is configured to:
control coupling between the third current sink; and
control either the first current source circuit or the trans-impedance amplifier, wherein j is either one or M, and wherein j is a natural number.

10. The digital-to-analog converter of claim 6, wherein the trans-impedance amplifier comprises input ends and output ends, wherein a first common-mode voltage of the output ends is different from a second common-mode voltage of the input ends.

11. The digital-to-analog converter of claim 6, wherein the second current source circuit is configured to regulate a quiescent current $I_2$ flowing through the second current source circuit to control a common mode current flowing through a trans impedance amplifier, and wherein the current $I_1$ and the quiescent current $I_2$ meet $0<I_2<I_1$.

12. The digital-to-analog converter of claim 6, wherein each first switch group comprises at least one P-type metal-oxide-semiconductor (MOS) field-effect transistor, wherein each second switch group comprises at least one P-type MOS transistor, wherein a first end of the first switch group and a first end of the second switch group respectively correspond to sources of the P-type MOS transistors, and wherein the second end of the first switch group and the second end of the second switch group respectively correspond to drains of the P-type MOS transistors.

13. The digital-to-analog converter of claim 6, wherein the second current source circuit further comprises:
S first controllable current sources correspondingly coupled to a first input end of the trans-impedance amplifier; and
S second controllable current sources correspondingly coupled to a second input end of the trans-impedance amplifier,
wherein a quiescent current $I_2$ flowing through the second current source circuit is a sum of currents flowing through the S first controllable current sources and currents flowing through the S second controllable current sources, and wherein S is a natural number greater than or equal to one.

14. The digital-to-analog converter of claim 13, wherein each of the S first controllable current sources comprises
a seventh switch group; and
a second current source;
wherein each of the S second controllable current sources comprises
an eighth switch group; and
a third current source;
wherein the quiescent current $I_2$ flowing through the second current source is equal to zero when the seventh switch groups of the S first controllable current sources and the eighth switch groups of the S second controllable current sources are all in an open state,
wherein the quiescent current $I_2$ flowing through the second current source supplied by the first current source meets $0<I_2<I_1$ when the seventh switch group of at least one of the S first controllable current sources is in a closed state and the eighth switch group of at least one of the S second controllable current sources is in the closed state, and
wherein the seventh switch group is in a $y^{th}$ first controllable current source in the S first controllable current sources and is configured to control coupling between the second current source and either the first current source or the trans-impedance amplifier, wherein the eighth switch group is in a $y^{th}$ second controllable current source in the S second controllable current sources and is configured to control coupling between the third current source, and either the first current source or the trans-impedance amplifier, and wherein y is either 1 or S, wherein y is a natural number.

15. The digital-to-analog converter of claim 6, wherein each third switch group comprises at least one N-type MOS transistor, wherein each fourth switch group comprises the at least one N- type MOS transistor, wherein a first end of the third switch group and a first end of the fourth switch group respectively correspond to source terminals of the N-type MOS transistors, and wherein the second end of the third switch group and the second end of the fourth switch group respectively correspond to drain terminals of the N-type MOS transistors.

* * * * *

UNITED STATES PATENT AND TRADEMARK OFFICE
CERTIFICATE OF CORRECTION

PATENT NO. : 10,998,912 B2  
APPLICATION NO. : 16/580182  
DATED : May 4, 2021  
INVENTOR(S) : Chenlong Hou and Yuemiao Di Page 1 of 1

It is certified that error appears in the above-identified patent and that said Letters Patent is hereby corrected as shown below:

In the Claims

Claim 9, Column 30, Line 62: "source circuit meets $0 < k\ I_2 < I_1$" should read "source circuit meets $0 < I_2 < I_1$"

Claim 11, Column 31, Line 22: "current $I_2$ meet $0 < I_2 < I_1$" should read "current $I_2$ meet $0 \leq I_2 < I_1$"

Signed and Sealed this  
Fifteenth Day of June, 2021

Drew Hirshfeld  
*Performing the Functions and Duties of the*  
*Under Secretary of Commerce for Intellectual Property and*  
*Director of the United States Patent and Trademark Office*